United States Patent
Shi

(10) Patent No.: US 10,936,933 B2
(45) Date of Patent: Mar. 2, 2021

(54) ANTENNA DEVICE AND ELECTRONIC DEVICE

(71) Applicant: Murata Manufacturing Co., Ltd., Nagaokakyo (JP)

(72) Inventor: Xiaodong Shi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 334 days.

(21) Appl. No.: 15/835,614

(22) Filed: Dec. 8, 2017

(65) Prior Publication Data

US 2018/0107913 A1    Apr. 19, 2018

Related U.S. Application Data

(63) Continuation of application No. PCT/JP2016/071789, filed on Jul. 26, 2016.

(30) Foreign Application Priority Data

Aug. 3, 2015    (JP) .............................. JP2015-153095
Mar. 15, 2016    (JP) .............................. JP2016-050400

(51) Int. Cl.
*H01Q 1/36*    (2006.01)
*G06K 19/077*    (2006.01)
(Continued)

(52) U.S. Cl.
CPC ... *G06K 19/07779* (2013.01); *G06K 7/10178* (2013.01); *G06K 7/10336* (2013.01);
(Continued)

(58) Field of Classification Search
None
See application file for complete search history.

(56) References Cited

U.S. PATENT DOCUMENTS 7,740,738 B2 * 6/2010 Kim ...................... H01J 37/321
                                                    156/345.48
9,627,762 B2 * 4/2017 Ito ............................ H01Q 1/38
(Continued)

FOREIGN PATENT DOCUMENTS

JP    2004-164547 A    6/2004
JP    2015-216505 A    12/2015
(Continued)

OTHER PUBLICATIONS

Official Communication issued in International Patent Application No. PCT/JP2016/071789, dated Oct. 18, 2016.

*Primary Examiner* — Trinh V Dinh
(74) *Attorney, Agent, or Firm* — Keating & Bennett, LLP

(57) ABSTRACT

An antenna device includes a coil antenna including a coil conductor wound around a winding axis, and a planar conductor. The coil antenna includes a first region in which the coil conductor overlaps the planar conductor in a plan view of the planar conductor (when viewed from the Z-direction) and a second region in which the coil conductor does not overlap the planar conductor in the plan view of the planar conductor. The line width of the coil conductor in the first region is wider than the line width of a portion (portion extending in the X-direction) of the coil conductor in the second region. Accordingly, an inductance per unit length in the circumferential direction of the coil conductor in the first region is lower than the inductance per unit length in the circumferential direction of the coil conductor in the second region.

13 Claims, 21 Drawing Sheets

(51) Int. Cl.
    *H01Q 7/00*           (2006.01)
    *H04B 5/00*           (2006.01)
    *G06K 7/10*           (2006.01)
    *H01Q 1/24*           (2006.01)
    *H01Q 1/52*           (2006.01)
    *H01Q 1/38*           (2006.01)

(52) U.S. Cl.
CPC ....... *G06K 19/07783* (2013.01); *H01Q 1/243* (2013.01); *H01Q 1/523* (2013.01); *H01Q 1/526* (2013.01); *H01Q 7/00* (2013.01); *H04B 5/0031* (2013.01); *H04B 5/0081* (2013.01); *H01L 2223/6677* (2013.01); *H01L 2924/3025* (2013.01); *H01Q 1/38* (2013.01)

(56) References Cited

U.S. PATENT DOCUMENTS

| | | | | |
|---|---|---|---|---|
| 10,170,835 B2* | 1/2019 | Murayama | ........... | H04B 5/0081 |
| 2005/0040997 A1 | 2/2005 | Akiho et al. | | |
| 2007/0229271 A1* | 10/2007 | Shionoiri | ........... | G06K 7/10178 340/572.1 |
| 2009/0295547 A1* | 12/2009 | Takeda | ................. | G06K 7/0008 340/10.34 |
| 2010/0214187 A1 | 8/2010 | Sugita et al. | | |
| 2011/0031320 A1 | 2/2011 | Kato et al. | | |
| 2011/0290892 A1* | 12/2011 | Ozawa | ............ | G06K 19/07749 235/488 |
| 2011/0309049 A1* | 12/2011 | Papasouliotis | .... | H01J 37/32412 216/37 |
| 2012/0091821 A1 | 4/2012 | Kato et al. | | |
| 2012/0176282 A1 | 7/2012 | Kato et al. | | |
| 2012/0208606 A1 | 8/2012 | Kubo et al. | | |
| 2013/0147670 A1 | 6/2013 | Nakano et al. | | |
| 2013/0154891 A1* | 6/2013 | Kubo | ................. | G06K 19/0779 343/788 |
| 2013/0307746 A1* | 11/2013 | Nakano | ................. | H01Q 1/2225 343/850 |
| 2014/0184462 A1* | 7/2014 | Yosui | ...................... | H01Q 7/06 343/788 |
| 2014/0191916 A1* | 7/2014 | Ito | ............................ | H01Q 7/06 343/788 |
| 2014/0198006 A1* | 7/2014 | Nakano | ............. | G06K 7/10178 343/788 |
| 2015/0236418 A1* | 8/2015 | Ito | ........................... | H01Q 7/06 343/788 |
| 2015/0325917 A1* | 11/2015 | Ito | ........................... | H01Q 7/00 343/702 |

FOREIGN PATENT DOCUMENTS

| | | |
|---|---|---|
| WO | 2006/134935 A1 | 12/2006 |
| WO | 2007/105606 A1 | 9/2007 |
| WO | 2009/142114 A1 | 11/2009 |
| WO | 2010/055683 A1 | 5/2010 |
| WO | 2010/122685 A1 | 10/2010 |
| WO | 2011/062238 A1 | 5/2011 |
| WO | 2011/077877 A1 | 6/2011 |
| WO | 2012/053412 A1 | 4/2012 |

* cited by examiner

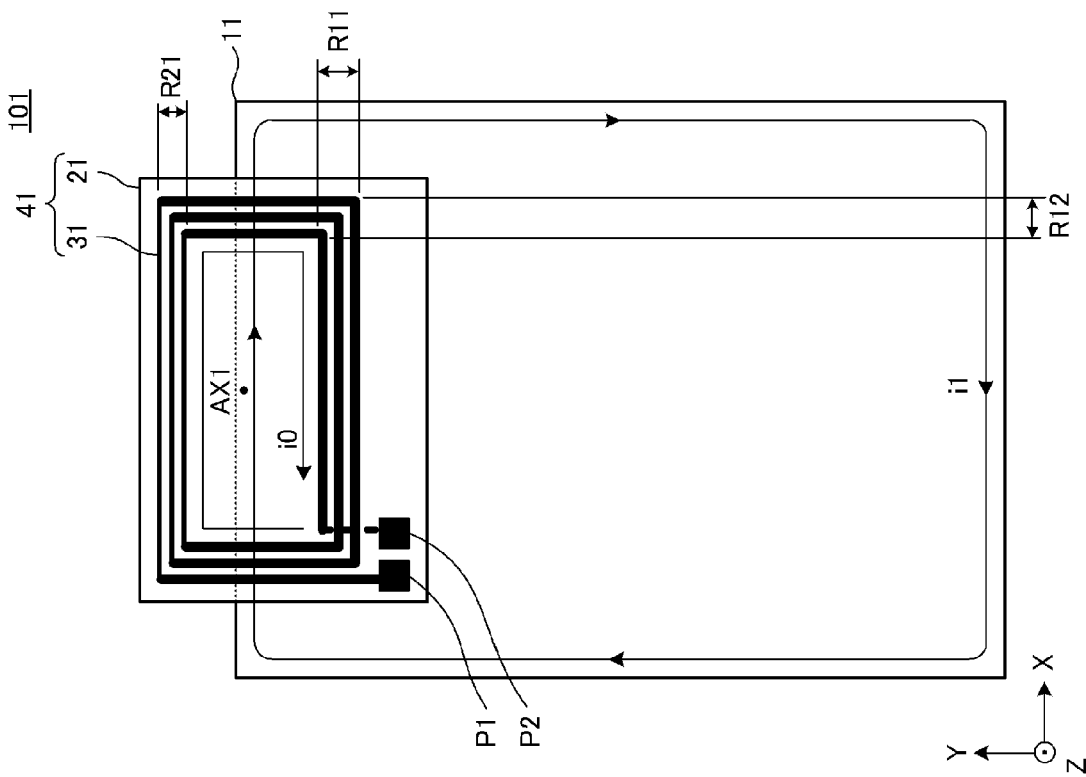
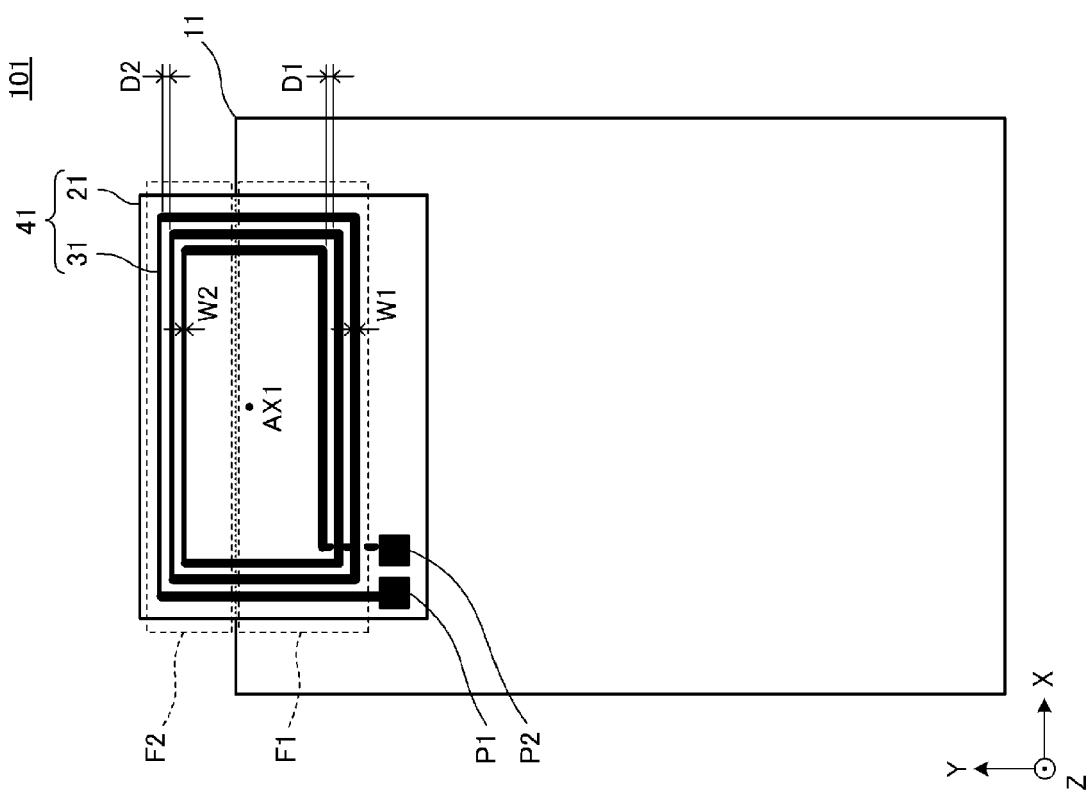

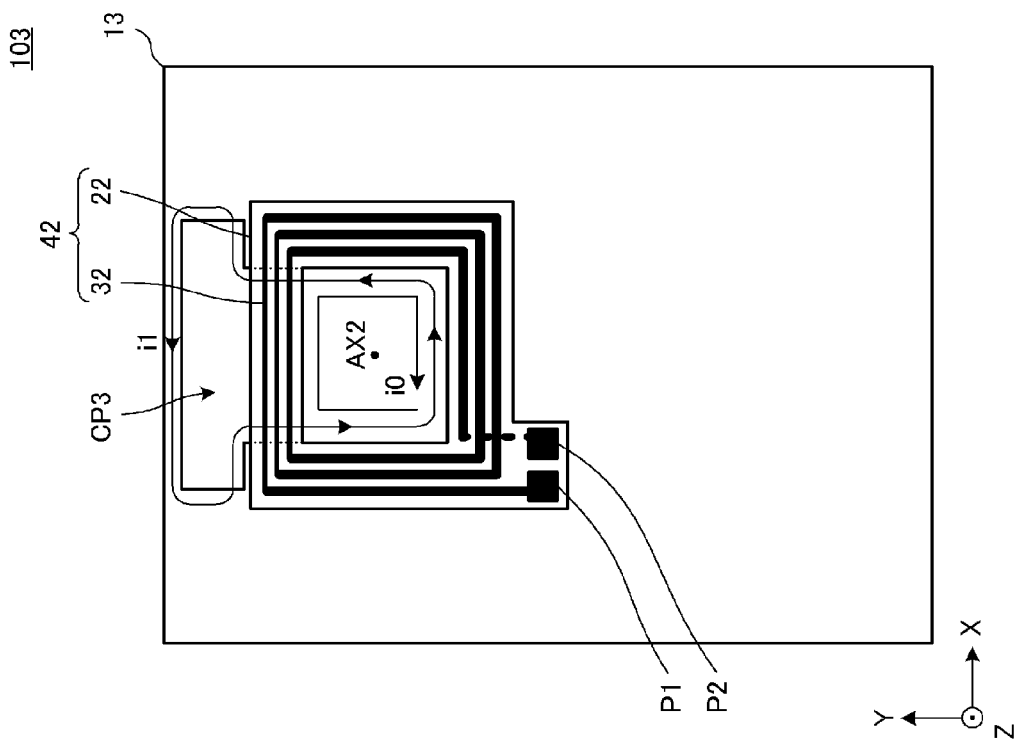
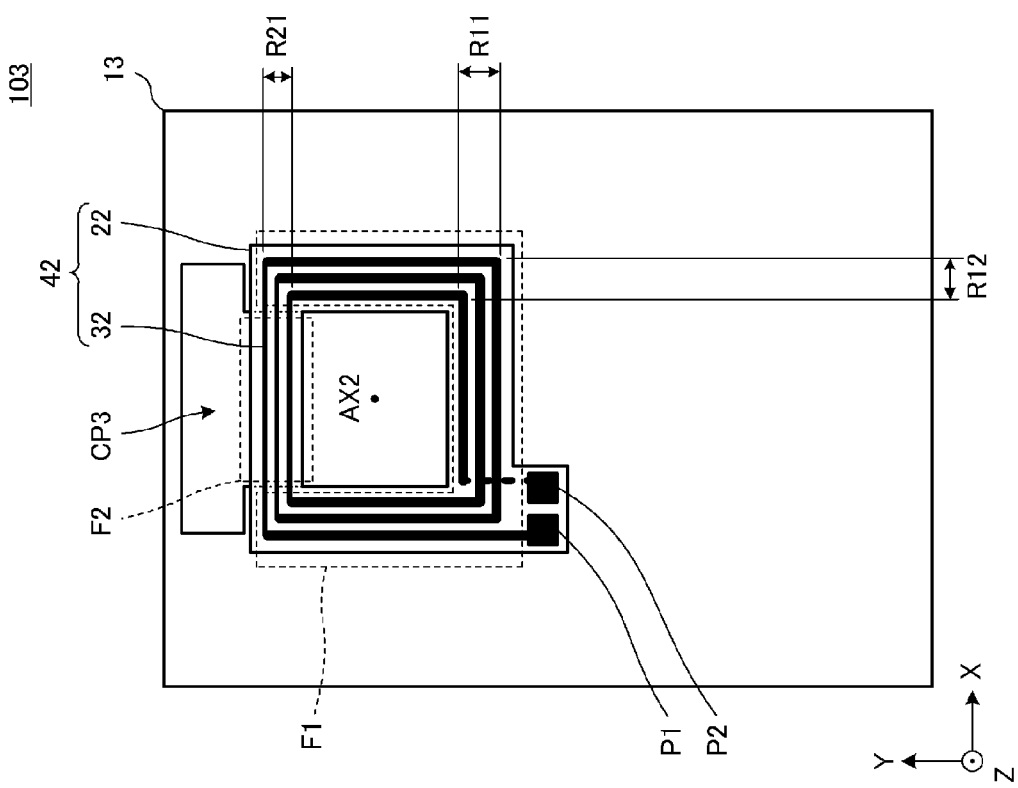

ANTENNA DEVICE AND ELECTRONIC DEVICE

CROSS REFERENCE TO RELATED APPLICATIONS

This application claims the benefit of priority to Japanese Patent Application No. 2015-153095 filed on Aug. 3, 2015 and Japanese Patent Application No. 2016-050400 filed on Mar. 15, 2016 and is a Continuation Application of PCT application Ser. No. PCT/JP2016/071789 filed on Jul. 26, 2016. The entire contents of each application are hereby incorporated herein by reference.

BACKGROUND OF THE INVENTION

1. Field of the Invention

The present invention relates to an antenna device and an electronic device.

2. Description of the Related Art

HF-band RFID, for example, near field communication (NFC) is implemented on electronic devices, for example, cellular phone handsets. Typically, RFID IC chips and matching devices are mounted mainly on printed circuit boards, and antennas are attached to the inside of housings of the devices.

The thickness of these electronic devices has been decreased, and the electronic devices are increasingly "metallized" to compensate for a lack of the strength due to the decreased thickness, for example, such that handset housings are plated with magnesium. Accordingly, in each electronic device, a planar conductor, for example, the housing, and a coil antenna overlap in a plan view.

For example, International Publication No. 2010/122685 discloses an antenna device in which a planar conductor (conductor layer) including an area larger than that of a coil antenna and the coil antenna overlap (are close to each other) in a plan view. In the antenna device, magnetic field coupling between the coil antenna and the planar conductor enables the planar conductor to define and function as a booster antenna for the coil antenna.

With the structure of the antenna device disclosed in International Publication No. 2010/122685, however, the inductance of the coil antenna varies depending on positional relationships, for example, the range (area) in which the planar conductor and the coil antenna overlap, and the distance between the planar conductor and the coil antenna. The variation in the inductance of the coil antenna varies, for example, the resonant frequency of a resonant circuit including the coil antenna. Consequently, the communication characteristics of a communication circuit that includes the coil antenna is unstable. Accordingly, the coil antenna and the planar conductor are required to include high dimensional accuracy (dimensional accuracy of, for example, components and a coil conductor) and high assembly accuracy.

SUMMARY OF THE INVENTION

Preferred embodiments of the present invention provide antenna devices that do not need high dimensional accuracy and high assembly accuracy to enable the inductance of the coil antenna to be prevented from varying even in the case where the coil antenna and the planar conductor overlap in a plan view. Preferred embodiments of the present invention also provide electronic devices that include the antenna devices.

An antenna device according to a preferred embodiment of the present invention includes a coil antenna including a coil conductor wound around an axis, and a planar conductor. The coil antenna includes a first region in which the coil conductor overlaps the planar conductor in a plan view of the planar conductor and a second region in which the coil conductor does not overlap the planar conductor in the plan view of the planar conductor. An average radial width of the coil conductor in the first region is wider than the average radial width of the coil conductor in the second region.

An antenna device according to a preferred embodiment of the present invention includes a coil antenna including a coil conductor wound around an axis, and a planar conductor. The coil antenna includes a first region in which the coil conductor overlaps the planar conductor in a plan view of the planar conductor and a second region in which the coil conductor does not overlap the planar conductor in the plan view of the planar conductor. The number of lines of the coil conductor per unit length in a radial direction of the coil conductor in the first region is less than the number of lines of the coil conductor per unit length in the radial direction of the coil conductor in the second region.

An antenna device according to a preferred embodiment of the present invention includes a coil antenna including a coil conductor wound around an axis, and a planar conductor. The coil antenna includes a first region in which the coil conductor overlaps the planar conductor in a plan view of the planar conductor and a second region in which the coil conductor does not overlap the planar conductor in the plan view of the planar conductor. An inductance per unit length in a circumferential direction of the coil conductor in the first region is lower than the inductance per unit length in the circumferential direction of the coil conductor in the second region.

With the structure described above, the first region, in which the inductance per unit length in the circumferential direction of the coil conductor is low, overlaps the planar conductor in a plan view of the planar conductor, and a variation in the inductance of the coil antenna due to the positional relationships between the planar conductor and the coil antenna is slight. Thus, an antenna device that does not need high dimensional accuracy and high assembly accuracy to enable the inductance of the coil antenna to be prevented from varying is able to be provided. Accordingly, a variation in, for example, the resonant frequency of a communication circuit that includes the coil antenna is able to be decreased even in the case where the planar conductor and the coil antenna overlap. In addition, the communication characteristics of the communication circuit is stable.

In the structure described above, the line width of a portion of the coil conductor in the first region is preferably wider than that in the second region. The inductance of a coil in the case where the line width of the coil conductor is wide is lower than that in the case where the line width of the coil conductor defining the coil is narrow. Accordingly, the inductance per unit length in the circumferential direction of the coil conductor in the first region is lower than the inductance per unit length in the circumferential direction of the coil conductor in the second region. Accordingly, the structure described above is able to provide an antenna device that does not need high dimensional accuracy and high assembly accuracy to enable the inductance of the coil antenna to be prevented from varying.

In the structure described above, the number of turns of the coil conductor is preferably more than one, and the distance between adjoining lines of a portion of the coil conductor in the first region is preferably longer than that in the second region. The inductance of the coil in the case where the distance between adjoining lines of the coil conductor is long is lower than in the case where adjoining lines of the coil conductor is short. Accordingly, the inductance per unit length in the circumferential direction of the coil conductor in the first region is lower than the inductance per unit length in the circumferential direction of the coil conductor in the second region. Accordingly, the structure described above is able to provide an antenna device that does not need high dimensional accuracy and high assembly accuracy to enable the inductance of the coil antenna to be prevented from varying.

In the structure described above, the planar conductor preferably includes a notch portion extending from the inside toward the outer edge, and at least a portion of a coil opening of the coil antenna preferably overlaps the notch portion in a plan view of the planar conductor. With the structure described above, the coil antenna and the notch portion of the planar conductor are coupled with each other with an electric field, a magnetic field, or an electromagnetic field located therebetween. In the case where an electric current flows through the coil antenna (coil conductor), an electric current is induced and encloses the notch portion of the planar conductor. However, since the notch portion extending from the inside toward the outer edge is provided in the planar conductor, no eddy current flows through the planar conductor, and the electric current flows along the outer edge of the planar conductor via the notch portion. Accordingly, with the structure described above, the planar conductor defines and functions as a booster antenna for the coil antenna.

An electronic device according to a preferred embodiment of the present invention includes a housing, an antenna device, and a power-supply circuit. The antenna device includes a coil antenna including a coil conductor wound around an axis, and a planar conductor. The coil antenna includes a first region in which the coil conductor overlaps the planar conductor in a plan view of the planar conductor and a second region in which the coil conductor does not overlap the planar conductor in the plan view of the planar conductor. An average radial width of the coil conductor in the first region is wider than the average radial width of the coil conductor in the second region. The power-supply circuit is electrically connected to the coil antenna.

An electronic device according to a preferred embodiment of the present invention includes a housing, an antenna device, and a power-supply circuit. The antenna device includes a coil antenna including a coil conductor wound around an axis, and a planar conductor. The coil antenna includes a first region in which the coil conductor overlaps the planar conductor in a plan view of the planar conductor and a second region in which the coil conductor does not overlap the planar conductor in the plan view of the planar conductor. The number of lines of the coil conductor per unit length in a radial direction of the coil conductor in the first region is less than the number of lines of the coil conductor per unit length in the radial direction of the coil conductor in the second region. The power-supply circuit is electrically connected to the coil antenna.

An electronic device according to a preferred embodiment of the present invention includes a housing, an antenna device, and a power-supply circuit. The antenna device includes a coil antenna including a coil conductor wound around an axis, and a planar conductor. The coil antenna includes a first region in which the coil conductor overlaps the planar conductor in a plan view of the planar conductor and a second region in which the coil conductor does not overlap the planar conductor in the plan view of the planar conductor. An inductance per unit length in a circumferential direction of the coil conductor in the first region is lower than the inductance per unit length in the circumferential direction of the coil conductor in the second region. The power-supply circuit is electrically connected to the coil antenna.

The structure described above is able to provide an electronic device that includes an antenna device that does not need high dimensional accuracy and high assembly accuracy to enable the inductance of the coil antenna to be prevented from varying even in the case where the coil antenna and the planar conductor overlap.

In the structure described above, the planar conductor is preferably a portion of the housing. With the structure described above, since the planar conductor is a portion of the housing, the antenna device is able to be readily constructed or manufactured. That is, it is not necessary to separately form the planar conductor, and thus, manufacture thereof is easy, and the cost thereof is able to be decreased.

Preferred embodiments of the present invention provide antenna devices that do not need high dimensional accuracy and high assembly accuracy to enable the inductance of the coil antenna to be prevented from varying even in the case where the coil antenna and the planar conductor overlap in a plan view. Preferred embodiments of the present invention also provide electronic devices that include the antenna devices.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a plan view of an antenna device according to a first preferred embodiment of the present invention, and FIG. 1B is a plan view of the antenna device and illustrates the relationship between an electric current flowing through a coil conductor and an electric current generated in a planar conductor.

FIG. 4A is a plan view of an antenna device according to a third preferred embodiment of the present invention, and FIG. 4B is a plan view of the antenna device and illustrates the relationship between an electric current flowing through the coil conductor and an electric current generated in a planar conductor.

8 is a plan view of an antenna device according to a sixth preferred embodiment of the present invention.

Figure 9A:
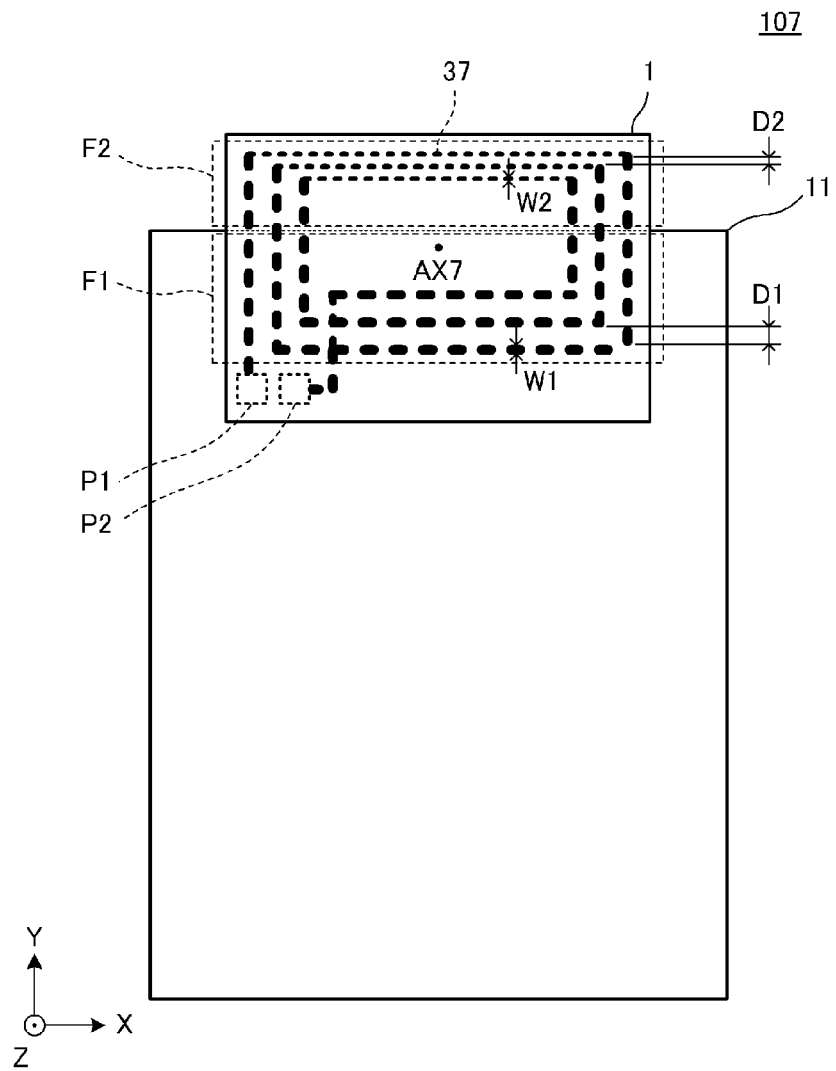
Figure 9B:
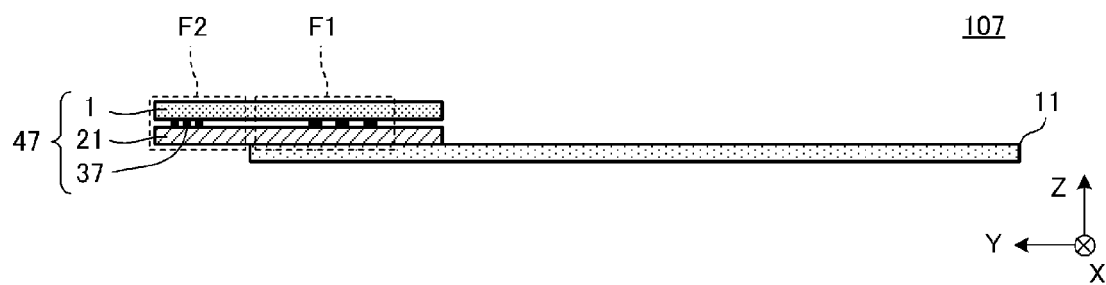

FIG. 9A is a plan view of an antenna device according to a seventh preferred embodiment of the present invention, and FIG. 9B is a sectional view of the antenna device.

Figure 10B:
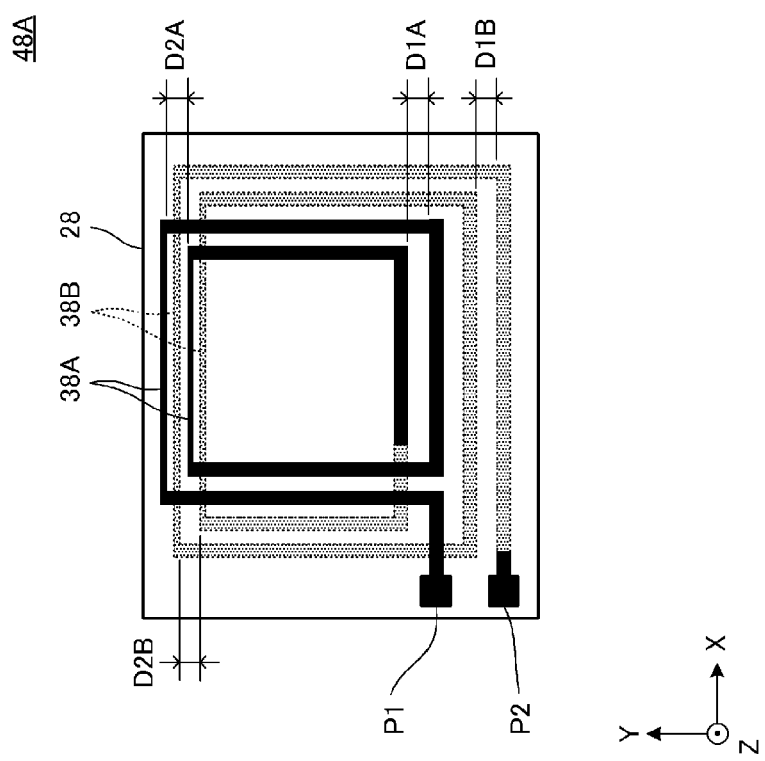
Figure 10A:
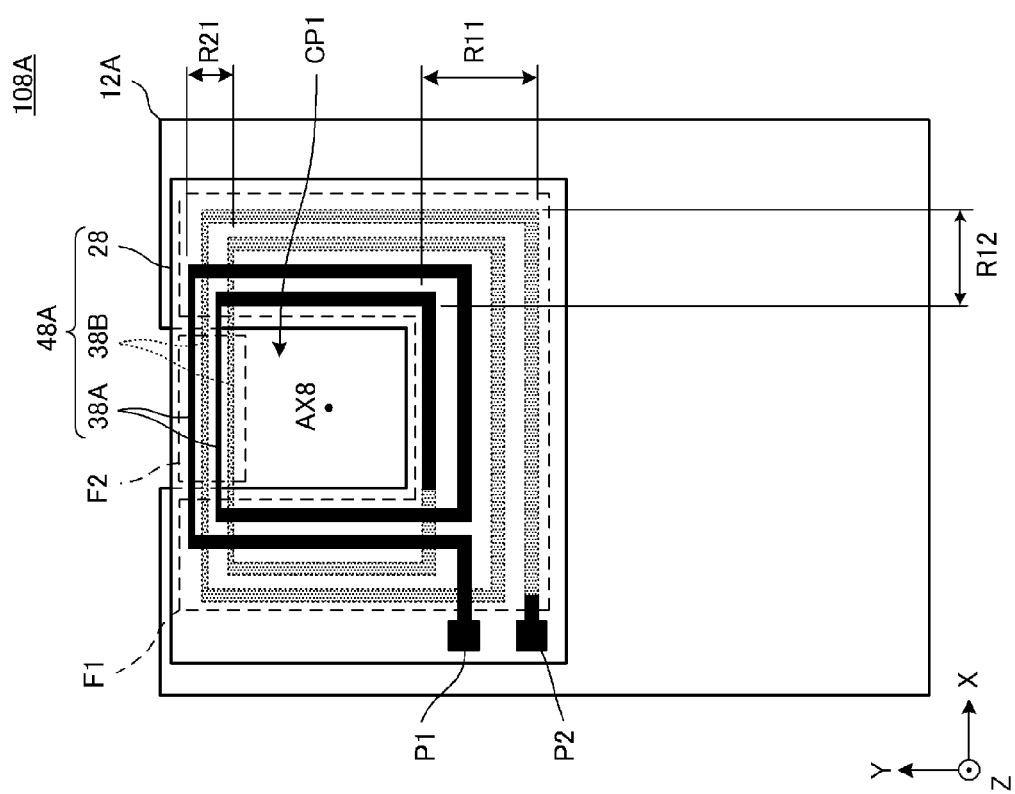

FIG. 10A is a plan view of an antenna device according to an eighth preferred embodiment of the present invention, and FIG. 10B is a plan view of a coil antenna that the antenna device includes.

Figure 11B:
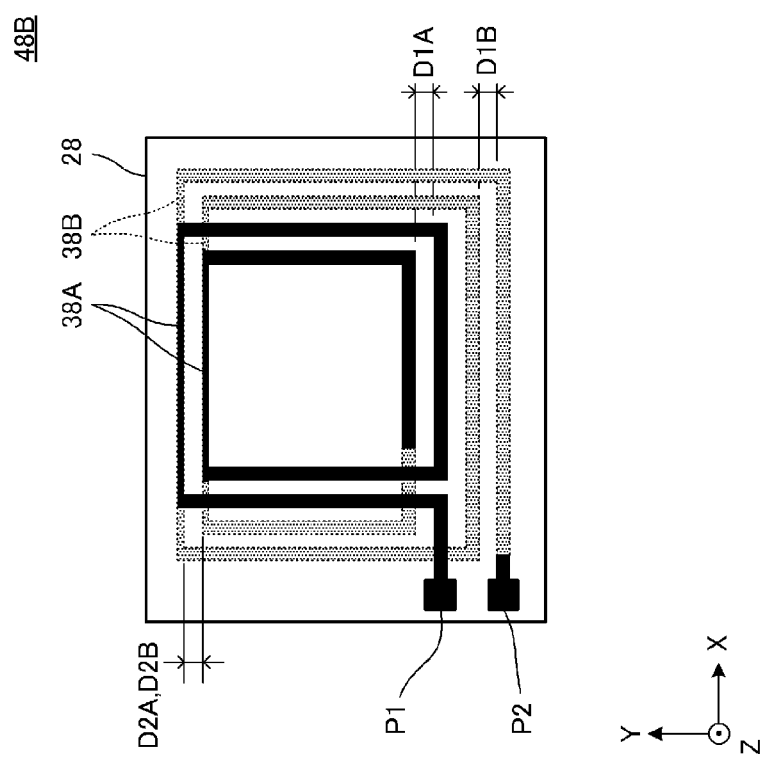
Figure 11A:
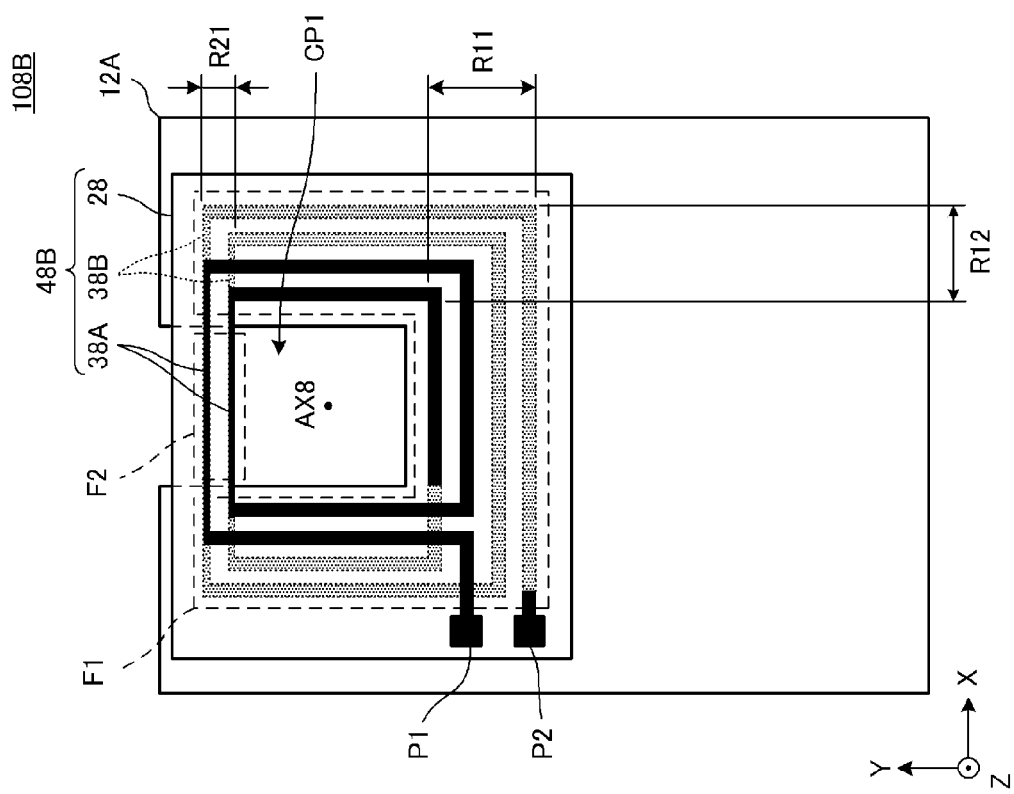

FIG. 11A is a plan view of another antenna device according to the eighth preferred embodiment of the present invention, and FIG. 11B is a plan view of a coil antenna that the antenna device includes.

Figure 12A:
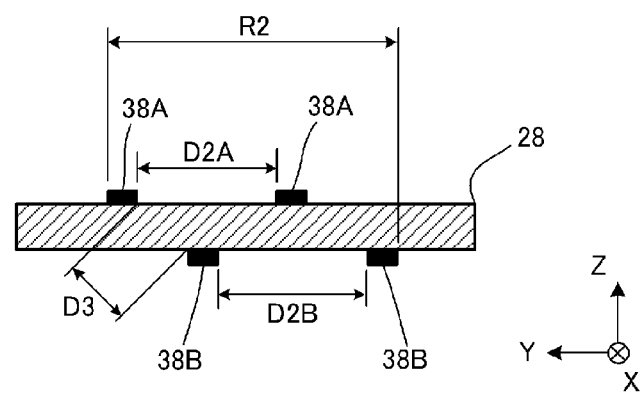
Figure 12B:
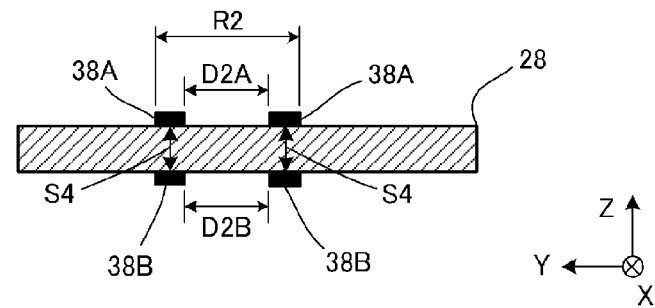

FIG. 12A is an enlarged sectional view of the antenna device in a second region, and FIG. 12B is an enlarged sectional view of the antenna device in the second region.

Figure 13:
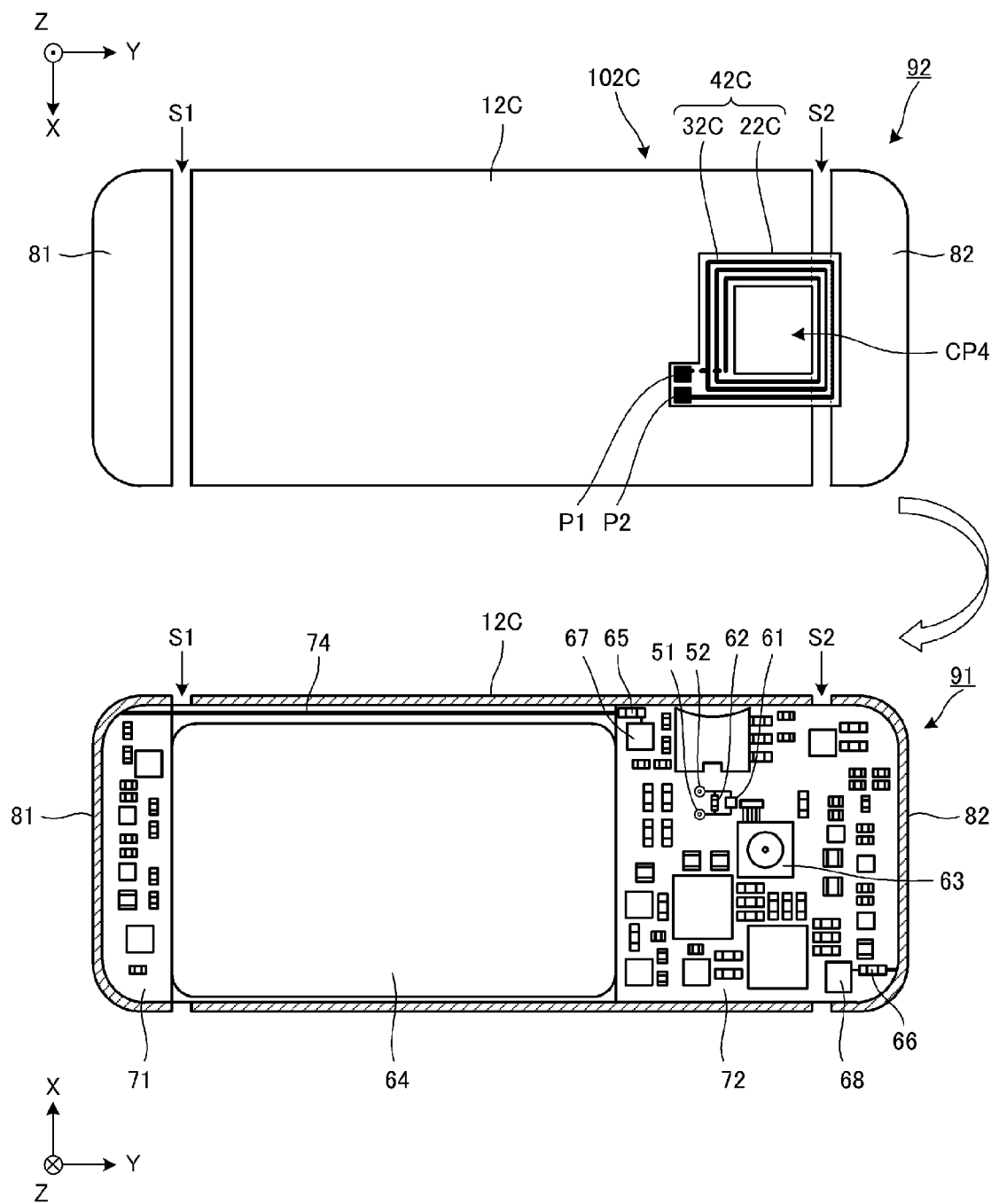

FIG. 13 is a plan view of the inner structure of a housing of an electronic device according to a ninth preferred embodiment of the present invention.

Figure 14:
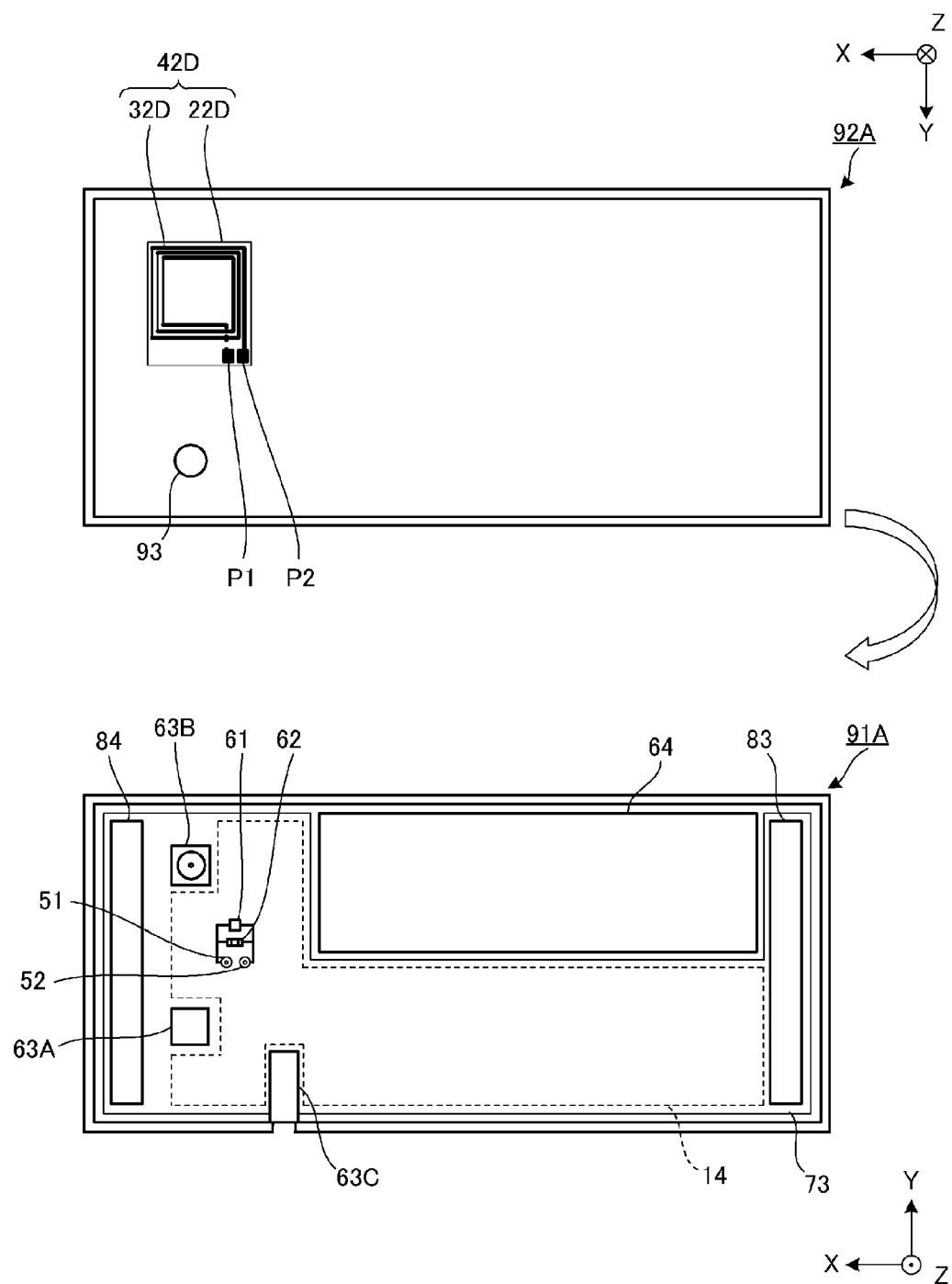

FIG. 14 is a plan view of the inner structure of a housing of an electronic device according to a tenth preferred embodiment of the present invention.

Figure 15:
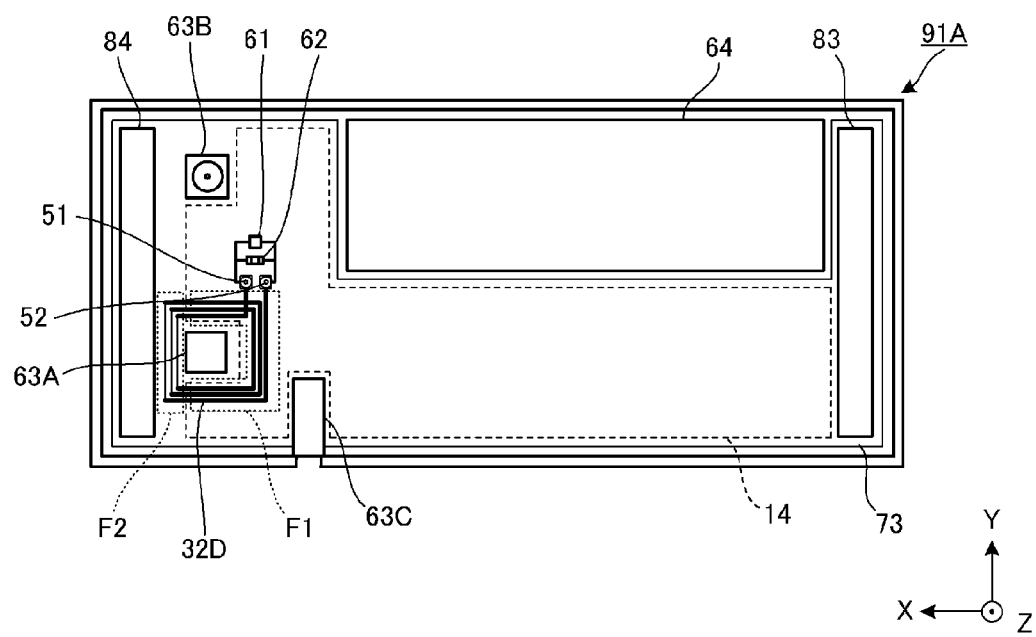

FIG. 15 is a plan view of an upper housing that the electronic device according to the tenth preferred embodiment of the present invention includes.

Figure 16:
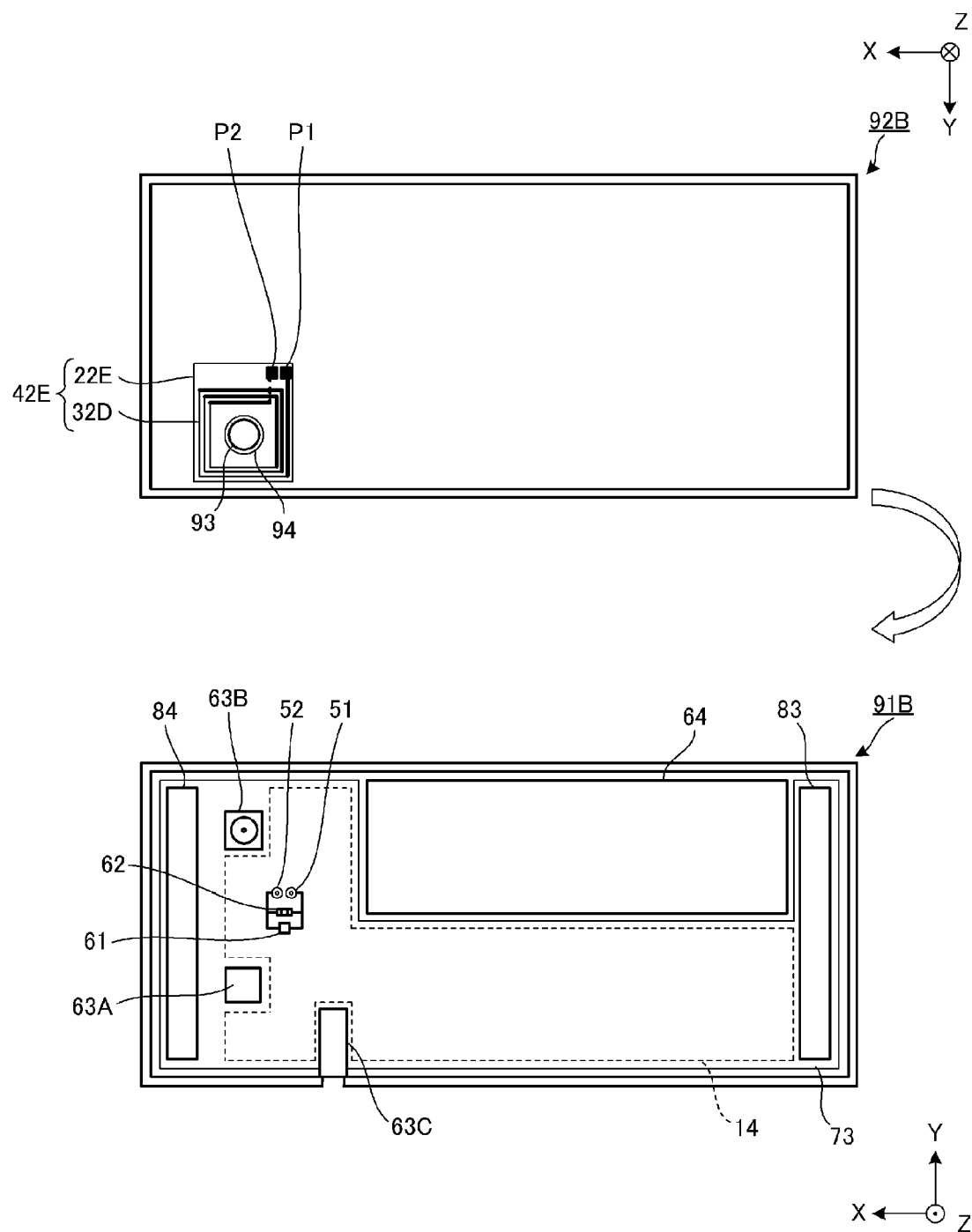

FIG. 16 is a plan view of the inner structure of a housing of an electronic device according to an eleventh preferred embodiment of the present invention.

Figure 17:
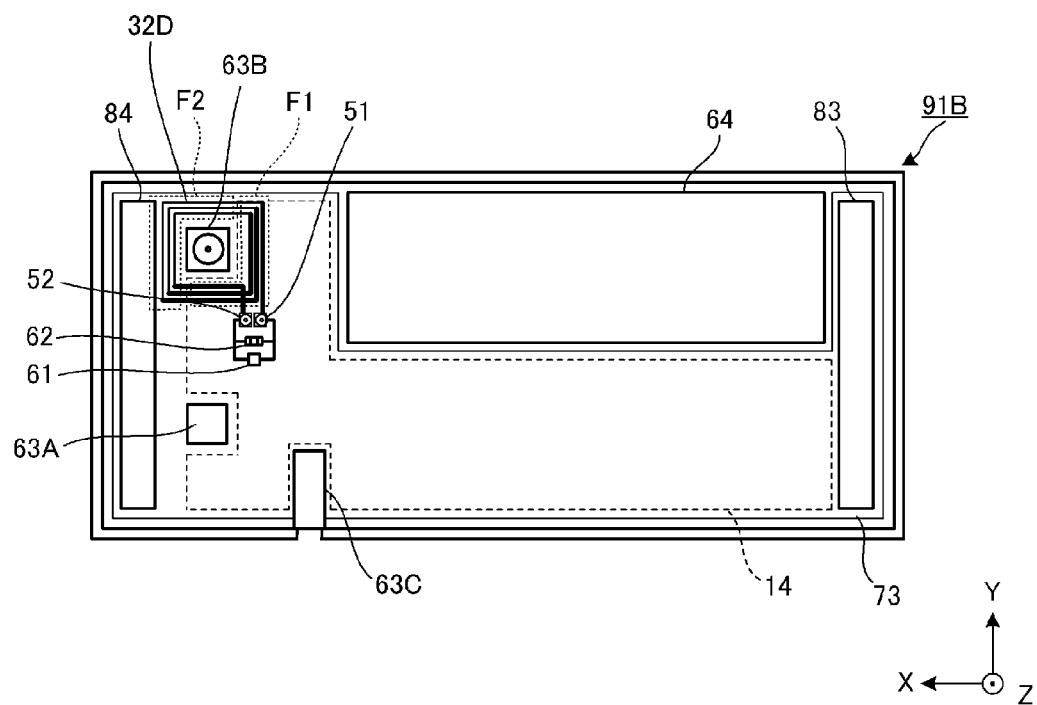

FIG. 17 is a plan view of an upper housing that the electronic device according to the eleventh preferred embodiment of the present invention includes.

Figure 18:
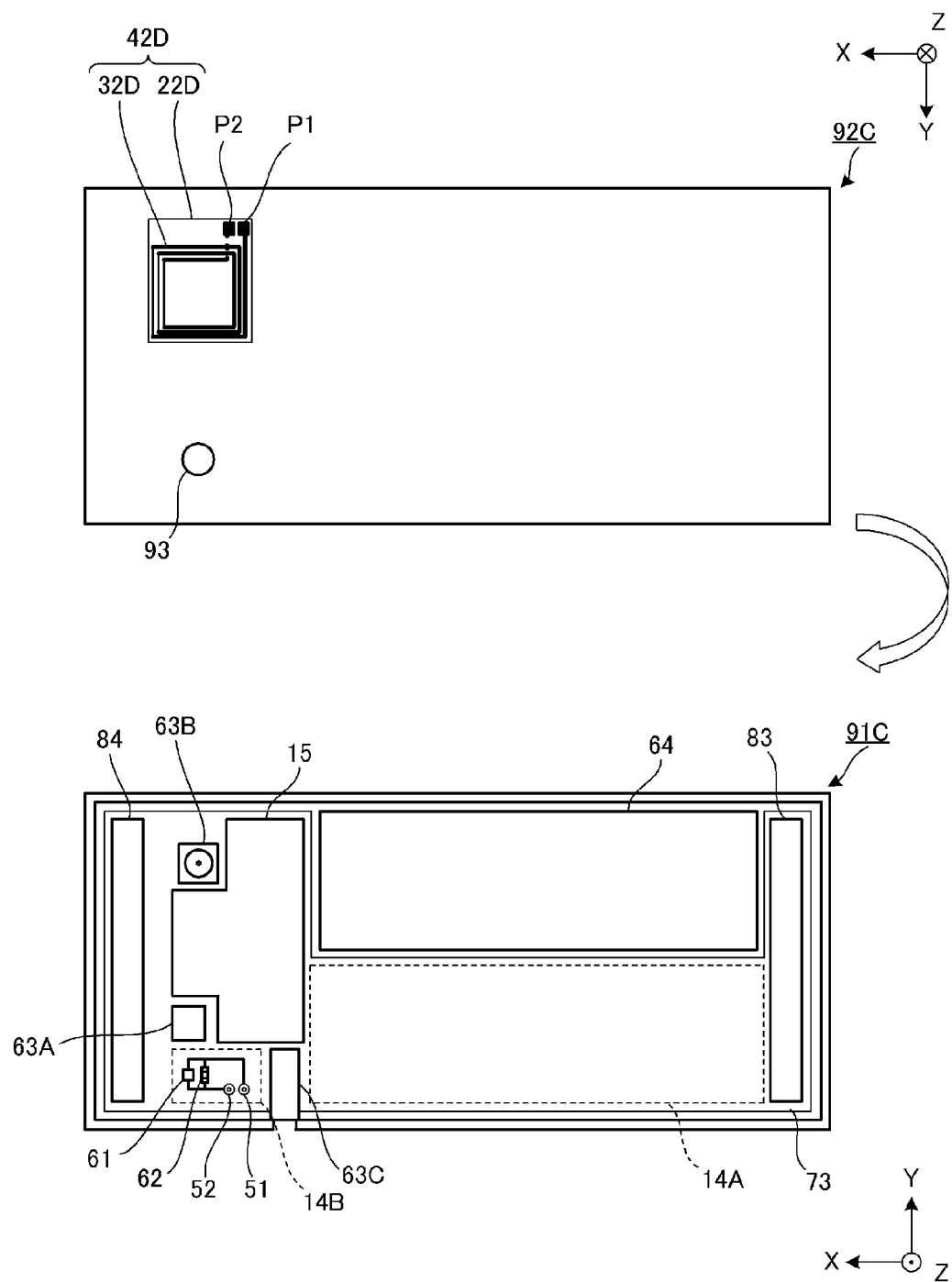

FIG. 18 is a plan view of the inner structure of a housing of an electronic device according to a twelfth preferred embodiment of the present invention.

Figure 19:
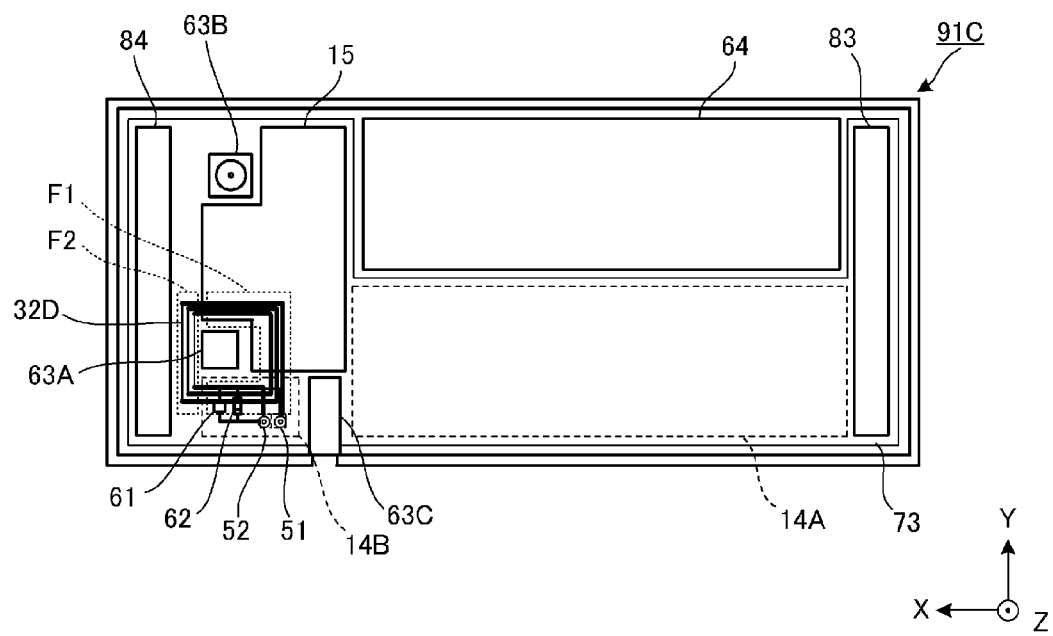

FIG. 19 is a plan view of an upper housing that the electronic device according to the twelfth preferred embodiment of the present invention includes.

Figure 20:
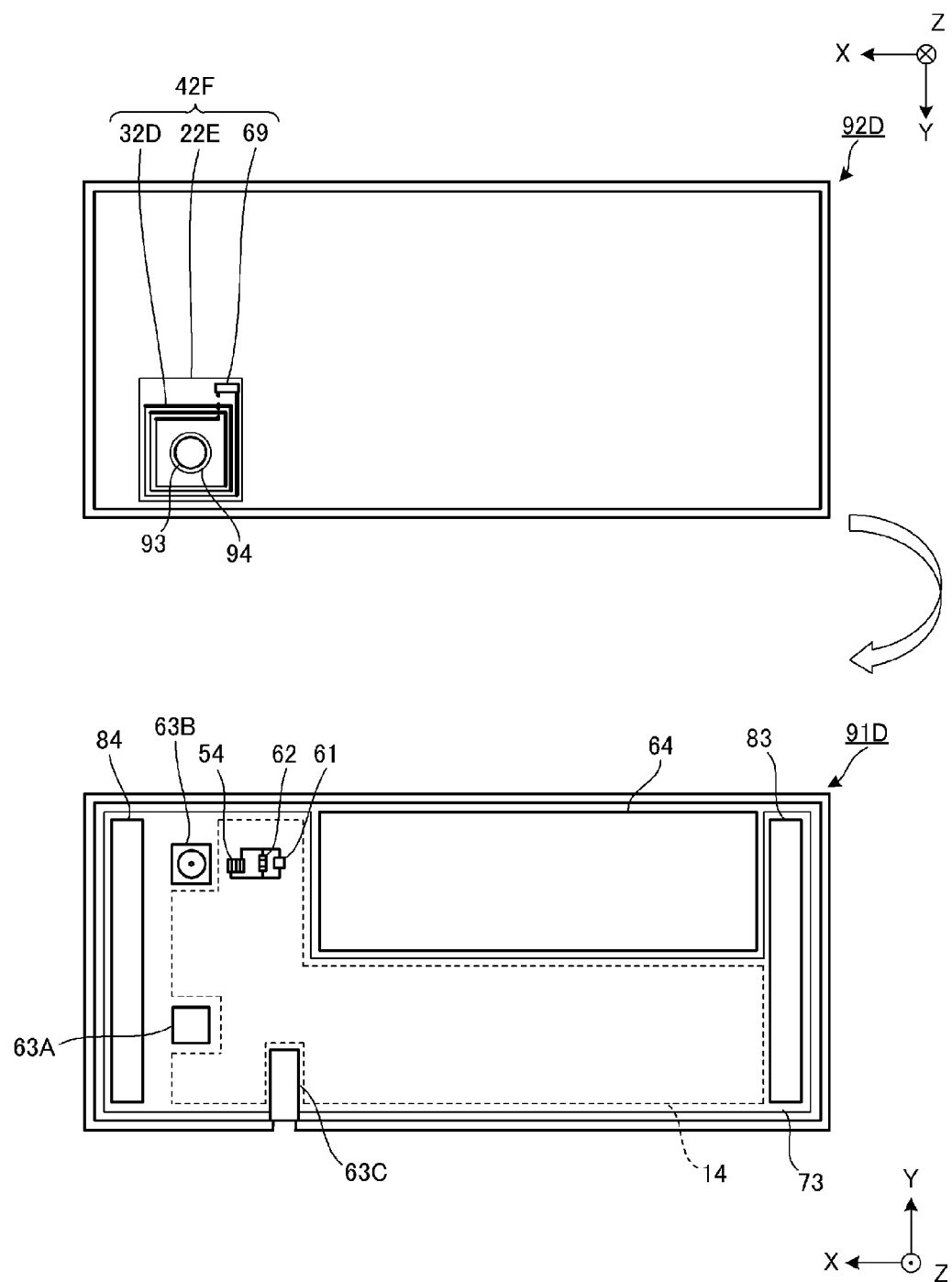

FIG. 20 is a plan view of the inner structure of a housing of an electronic device according to a thirteenth preferred embodiment of the present invention.

Figure 21:
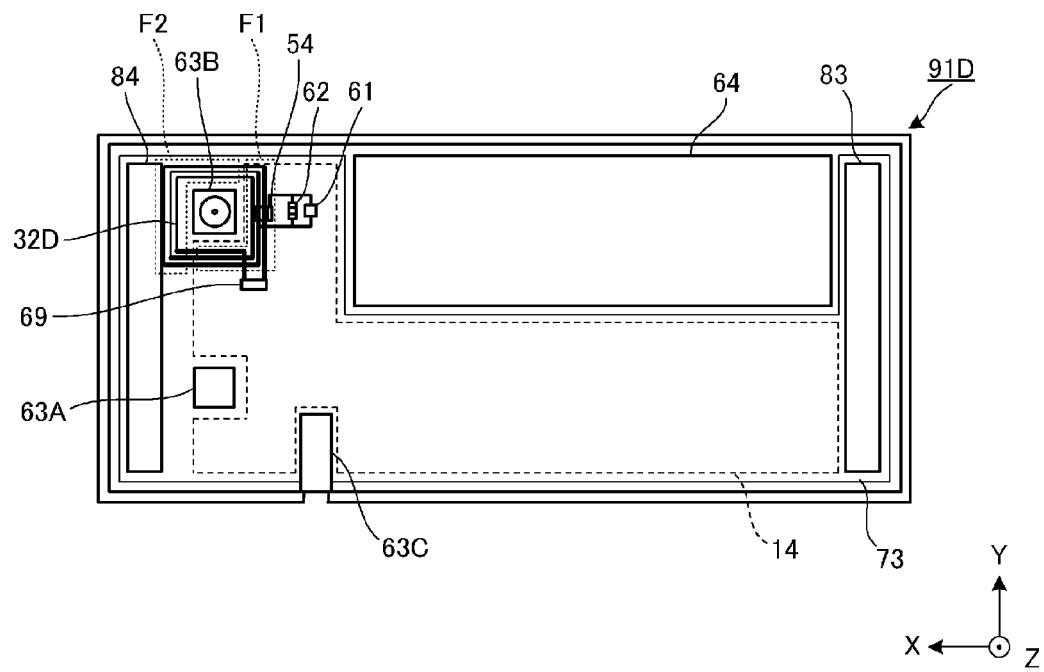

FIG. 21 is a plan view of an upper housing that the electronic device according to the thirteenth preferred embodiment of the present invention includes.

DETAILED DESCRIPTION OF THE PREFERRED EMBODIMENTS

Specific examples are hereinafter taken with reference to the drawings to describe preferred embodiments of the present invention. In the drawings, like components are designated by like reference signs. The preferred embodiments are described by way of example. The features described according to the preferred embodiments are able to be partially replaced or combined.

According to the preferred embodiments of the present invention described below, an "antenna device" is an antenna that radiates magnetic flux. The antenna device is an antenna preferably for use in close-range communication by magnetic field coupling with an antenna to be communicated and is implemented for, for example, NFC (Near field communication). The antenna device is preferably operated at a frequency band of, for example, a HF band, particularly at 13.56 MHz or near 13.56 MHz. The size of the antenna device is very small with respect to a wave length $\lambda$ at the communication frequency, and the radiation characteristics of an electromagnetic wave at the communication frequency band are poor. The size of a coil antenna that the antenna device includes, which is described later, preferably is less than about $\lambda/10$, for example. The wave length described herein indicates an effective wave length in consideration of shortening the wave length due to dielectric properties or magnetic permeability of a substrate on which the antenna is provided. Both ends of a coil conductor that the coil antenna includes are electrically connected to a power-supply circuit that adjusts the communication frequency band (HF band, particularly at 13.56 MHz or near 13.56 MHz).

First Preferred Embodiment

FIG. 1A is a plan view of an antenna device 101 according to a first preferred embodiment of the present invention, and FIG. 1B is a plan view of the antenna device 101 and illustrates the relationship between an electric current flowing through a coil conductor 31 and an electric current generated in a planar conductor 11.

The antenna device 101 includes the planar conductor 11 and a coil antenna 41. The planar conductor 11 and the coil antenna 41 partially overlap in a plan view of the planar conductor 11, when viewed from the Z-direction in FIG. 1A. The "Z-direction" in the description is a direction perpendicular or substantially perpendicular to a main surface of the planar conductor. The phrase "when viewed from the Z-direction" in the description corresponds to the phrase "in a plan view of the planar conductor" according to the preferred embodiments of the present invention.

The planar conductor 11 is a rectangular or substantially rectangular and flat or substantially flat board conductor. For example, the planar conductor 11 is a portion of a housing of an electronic device that includes the antenna device 101. An example of the planar conductor 11 may be a ground conductor provided on a printed circuit board included in the electronic device.

The coil antenna 41 includes a substrate 21, the coil conductor 31, and electrodes P1 and P2. The coil antenna 41 includes a first region F1 in which the coil conductor 31 overlaps the planar conductor 11 when viewed from the Z-direction and a second region F2 in which the coil conductor 31 does not overlap the planar conductor 11 when viewed from the Z-direction.

The substrate 21 is a rectangular or substantially rectangular and flat or substantially flat board including an insulating material. An example of the substrate 21 is a resin sheet, for example, a polyimide (PI) sheet or a liquid-crystal polymer (LCP) sheet.

The coil conductor 31 is wound around a winding axis AX1 at about three turns and is a rectangular or substantially rectangular spiral conductor pattern whose longitudinal direction coincides with a lateral direction (X-direction in FIG. 1A). According to the present preferred embodiment, the winding axis AX1 of the coil conductor 31 is parallel or substantially parallel to the Z-direction. The coil conductor 31 includes a spiral conductor and a routing conductor. An outer circumferential end of the spiral conductor provided on one main surface (front surface of the substrate 21 in FIG. 1A) of the substrate 21 is electrically connected to the electrode P1 provided on the one main surface of the substrate 21. An inner circumferential end of the spiral conductor is electrically connected to the electrode P2 provided on the one main surface of the substrate 21 in a state where an interlayer connection conductor and the routing conductor provided on the other main surface (back surface of the substrate 21 in FIG. 1A) of the substrate 21 are located therebetween. The electrodes P1 and P2 are electrically connected to a power-supply circuit, not illustrated. Examples of the coil conductor 31 and the electrodes P1 and P2 include Cu foil.

The coil antenna 41 and the planar conductor 11 of the antenna device 101 partially overlap when viewed from the Z-direction as described above. Accordingly, the coil antenna 41 includes the first region F1, in which the coil conductor 31 overlaps the planar conductor 11 when viewed from the Z-direction, and the second region F2, in which the coil conductor 31 does not overlap the planar conductor 11 when viewed from the Z-direction.

As illustrated in FIG. 1A, the line width (W1 in FIG. 1A) of the coil conductor 31 in the first region F1 is wider than the line width (W2) of a portion (portion extending in the X-direction) of the coil conductor 31 in the second region F2 (W1>W2). That is, the line width of a portion of the coil conductor 31 in the first region F1 is wider than that in the second region F2. In the antenna device 101, the distance (D1) between adjoining lines of the coil conductor 31 in the first region F1 is equal or substantially equal to the distance (D2) between adjoining lines of the coil conductor 31 in a portion of the second region F2 (D1=D2). The "distance between adjoining lines of the coil conductor" corresponds to a gap between lines of the coil conductor that are closest to each other and corresponds to not only a gap between lines of the coil conductor that are close to each other on a plane (XY plane) but also a gap between lines of the coil conductor that are closest to each other in three dimensions.

The inductance of a coil in the case where the line width of the coil conductor is wide is typically lower than that in the case where the line width of the coil conductor defining the coil is narrow. The reason is that the wide line width of the coil conductor causes an electric current flowing through the coil conductor to spread and decreases the amount of magnetic flux produced. Accordingly, the inductance per unit length in the circumferential direction of the coil conductor 31 in the first region F1 is lower than the inductance per unit length in the circumferential direction of the coil conductor 31 in the second region.

According to the preferred embodiments of the present invention, the "circumferential direction" of the coil conductor indicates, for example, a direction in which the coil conductor extends. According to the preferred embodiments of the present invention, the "radial direction" of the coil conductor indicates, for example, a direction perpendicular or substantially perpendicular to the direction in which the coil conductor extends. In other words, a direction along the coil opening surrounded by the coil conductor is the "circumferential direction" of the coil conductor, and a direction perpendicular or substantially perpendicular to the circumferential direction is the "radial direction" of the coil conductor.

The portion of the coil conductor 31 extending in the X-direction will now be described. The width (R11 in FIG. 1B) in the radial direction of the coil conductor 31 included in the first region F1 when viewed from the Z-direction is wider than the width (R21 in FIG. 1B) in the radial direction of the coil conductor 31 included in the second region F2 when viewed from the Z-direction (R11>R21). A portion of the coil conductor 31 extending in the Y-direction will now be described. The width (R12 in FIG. 1B) in the radial direction of the coil conductor 31 included in the first region F1 when viewed from the Z-direction is equal or substantially equal to the width (R12) in the radial direction of the coil conductor 31 included in the second region F2 when viewed from the Z-direction. That is, the average radial width (R1) of the coil conductor 31 in the first region F1 is wider than the average radial width (R2) of the coil conductor 31 in the second region F2 (R1>R2).

The "average radial width of the coil conductor in the first region" indicates the average value of the width in the radial direction of a portion of the coil conductor 31 included in the first region F1. The "average radial width of the coil conductor in the second region" indicates the average value of the width in the radial direction of a portion of the coil conductor 31 included in the second region F2. According to the present preferred embodiment, the average radial width (R1) of the coil conductor 31 in the first region F1 is a value between the widths (R11 and R12) in the radial direction of the coil conductor 31 included in the first region F1 when viewed from the Z-direction. According to the present preferred embodiment, the average radial width (R2) of the coil conductor 31 included in the second region F2 is a value between the widths (R21 and R12) in the radial direction of the coil conductor 31 included in the second region F2 when viewed from the Z-direction.

The number of lines of the coil conductor 31 per unit length (three/R1) in the radial direction of the coil conductor 31 included in the first region F1 when viewed from the Z-direction is less than the number of lines of the coil conductor 31 per unit length (three/R2) in the radial direction of the coil conductor 31 included in the second region F2 when viewed from the Z-direction (three/R1)<(three/R2)). The "number of lines of the coil conductor per unit length in the radial direction of the coil conductor included in the first region" is a value determined by dividing the number of lines of the coil conductor 31 in the first region F1 by the average radial width (R1) of the coil conductor 31 in the first region F1. The "number of lines of the coil conductor per unit length in the radial direction of the coil conductor included in the second region" is a value determined by dividing the number of lines of the coil conductor 31 in the second region F2 by the average radial width (R2) of the coil conductor 31 in the second region F2. Conductive portions of the coil conductor 31 that are electrically connected to each other in series are counted as the number of lines of the coil conductor. Conductive portions of the coil conductor 31 through which no electric current flows are not counted as the number of lines of the coil conductor. Conductive portions of the coil conductor 31 that are electrically connected to each other in parallel are counted as one as a whole.

The inductance of a portion of a coil that includes a wide width in the radial direction of the coil conductor is typically lower than that of a portion that includes a narrow width in the radial direction of the coil conductor defining the coil. The inductance of a portion of a coil that includes a large number of lines of the coil conductor per unit length in the radial direction of the coil conductor is typically larger than that of a portion that includes a small number of lines of the coil conductor per unit length in the radial direction of the coil conductor defining the coil. The reason is as follows: in the case where the distance (gap) between lines of the coil conductor is long and hence the width in the radial direction is wide, magnetic field coupling between the lines of the coil conductor weakens, and mutual inductance between the lines of the coil conductor decreases; and in the case where the line width of the coil conductor is wide and hence the width in the radial direction is wide, an electric current flowing through the coil conductor spreads, and the amount of magnetic flux produced decreases, as described above.

Accordingly, the inductance per unit length in the circumferential direction of the coil conductor 31 in the first region F1 is lower than the inductance per unit length in the circumferential direction of the coil conductor 31 in the second region.

With the structure described above, the first region, in which the inductance per unit length in the circumferential direction of the coil conductor 31 is low, overlaps the planar conductor 11 when viewed from the Z-direction, and a variation in the inductance of the coil antenna 41 due to the positional relationships between the planar conductor 11 and the coil antenna 41 is slight. Thus, an antenna device that does not need high dimensional accuracy and high assembly accuracy to enable the inductance of the coil antenna 41 to be prevented from varying is able to be provided. Accordingly, a variation in, for example, the resonant frequency of a communication circuit that includes the coil antenna is able to be decreased even in the case where the planar conductor 11 and the coil antenna 41 overlap. In addition, the communication characteristics of the communication circuit is stable.

In the antenna device 101, the coil antenna 41 (coil conductor 31) and the planar conductor 11 are coupled with each other with an electric field, a magnetic field, or an electromagnetic field located therebetween. Accordingly, in the case where an electric current i0 flows in a first direction (clockwise direction in FIG. 1B) of the coil conductor 31, an electric current i1 is induced in the planar conductor 11 due to the electric current i0. That is, at the location at which the coil conductor 31 and the planar conductor 11 are close to each other, the electric current i0 causes the electric current i1 in a direction in which the electric current i0 is reduced. At this time, the current density of the outer edge of the planar conductor 11 is high because of an edge effect. Accordingly, the electric current i1 induced in the planar conductor 11 flows along the outer edge of the planar conductor 11.

As illustrated in FIG. 1B, the direction in which the electric current i0 flows through the coil conductor 31 is the same or substantially the same as the direction in which the electric current i1 flows along the outer edge of the planar conductor 11. Accordingly, the planar conductor 11 defines and functions as a booster antenna for the coil antenna 41 (coil conductor 31), and the substantial area of the coil opening through which the magnetic flux enters and exits increases. Accordingly, the range and the distance of radiation (concentration) of the magnetic flux are increased and coupling with a coil antenna to be communicated is facilitated.

The features and effects in the case where the antenna device 101 is a transmitting antenna are described according to the above preferred embodiment. The features and effects are also provided due to antenna reciprocity theorem in the case where the sender and the receiver are conversed. That is, the features and effects are also provided in the case where the antenna device 101 is a receiving antenna.

Second Preferred Embodiment

Figure 2A:
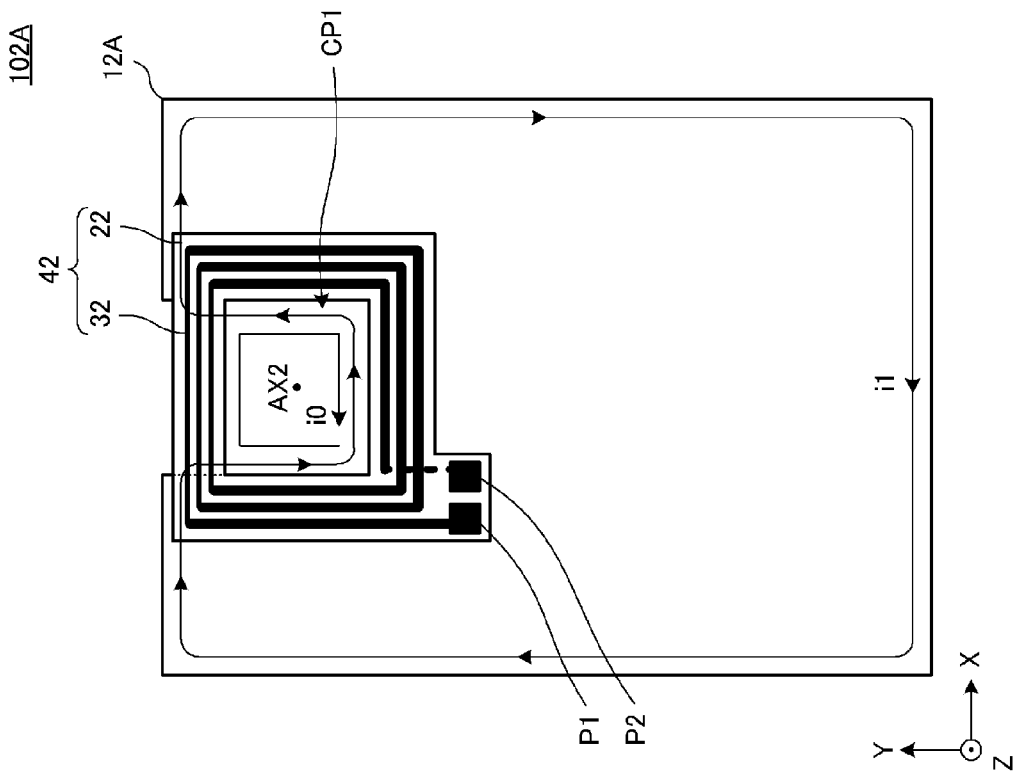
FIG. 2A is a plan view of an antenna device according to a second preferred embodiment of the present invention.
Figure 2B:
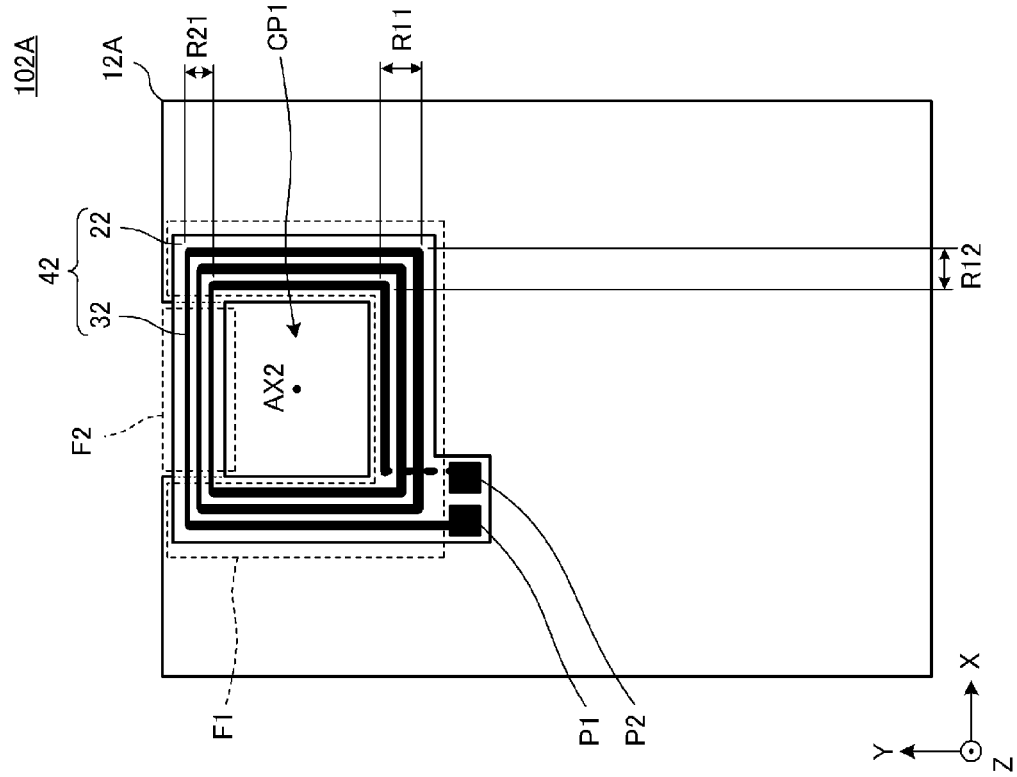
FIG. 2B is a plan view of the antenna device and illustrates the relationship between an electric current flowing through a coil conductor and an electric current generated in a planar conductor.
Figure 3A:
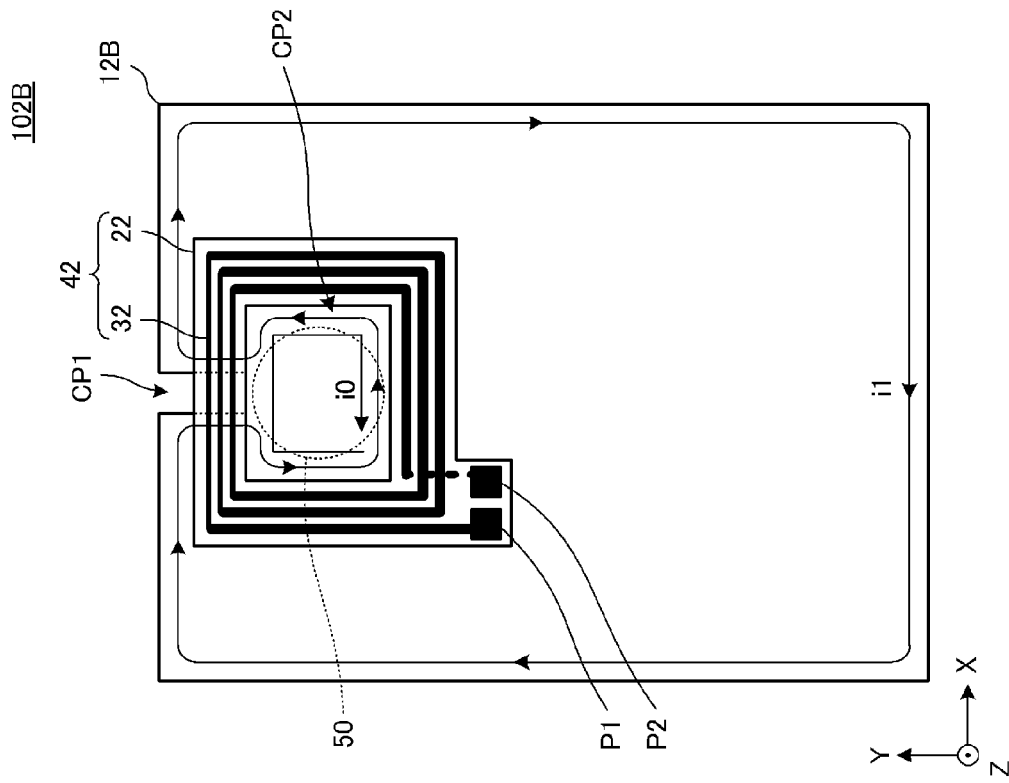
FIG. 3A is a plan view of an antenna device according to the second preferred embodiment of the present invention.
Figure 3B:
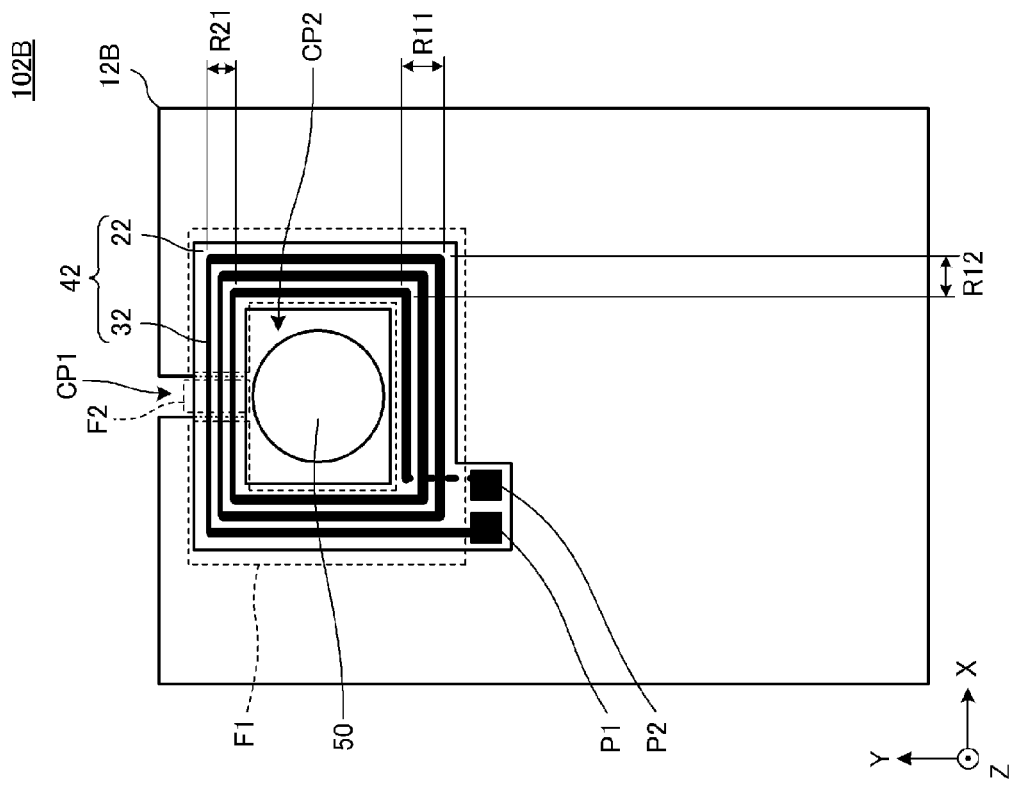
FIG. 3B is a plan view of the antenna device and illustrates the relationship between an electric current flowing through the coil conductor and an electric current generated in a planar conductor.

FIG. 2A is a plan view of an antenna device 102A according to a second preferred embodiment of the present invention, and FIG. 2B is a plan view of the antenna device 102A and illustrates the relationship between an electric current flowing through a coil conductor 32 and an electric current generated in a planar conductor 12A. FIG. 3A is a plan view of an antenna device 102B according to a second preferred embodiment of the present invention, and FIG. 3B is a plan view of the antenna device 102B and illustrates the relationship between an electric current flowing through the coil conductor 32 and an electric current generated in a planar conductor 12B.

The antenna devices 102A and 102B differ from the antenna device 101 according to the first preferred embodiment in the shape of a substrate 22 of a coil antenna 42 and the planar conductors 12A and 12B. The antenna devices 102B also differ from the antenna device 101 in including a device 50. The other structures are the same as or similar to the antenna device 101. The differences from the antenna device 101 according to the first preferred embodiment will now be described.

The coil conductor 32 is a square or substantially square spiral conductor pattern wound around a winding axis AX2. The substrate 22 of the coil antenna 42 is a flat or substantially flat board including the same or substantially the same shape (L-shape) as the external shape of the coil conductor 32 and the electrodes P1 and P2. The substrate 22 includes a rectangular or substantially rectangular opening at a position corresponding to the coil opening of the coil conductor 32.

The planar conductor 12A of the antenna device 102A is a flat or substantially flat board conductor that includes a shape (U-shape) including a dent and that includes a slit portion CP1 extending from the inside toward the outer edge when viewed from the Z-direction. The slit portion CP1 corresponds to a "notch portion".

At least a portion of the coil opening of the coil antenna 42 overlaps the slit portion CP1 when viewed from the Z-direction. Accordingly, the antenna device 102A includes the first region F1 and the second region F2 when viewed from the Z-direction. As illustrated in FIG. 2A, three sides (two sides in the X-direction and one side in the Y-direction) of the square or substantially square spiral coil conductor 32 overlap the planar conductor 12A when viewed from the Z-direction. Accordingly, the first region F1 of the antenna device 102A is larger than the first region F1 of the antenna device 101 according to the first preferred embodiment.

The planar conductor 12B of the antenna device 102B includes the slit portion CP1 extending from the inside toward the outer edge when viewed from the Z-direction and a wide portion CP2. The slit portion CP1 and the wide portion CP2 each correspond to the "notch portion".

At least a portion of the coil opening of the coil antenna 42 overlaps the wide portion CP2 when viewed from the Z-direction. Accordingly, the antenna device 102B includes the first region F1 and the second region F2 when viewed from the Z-direction. As illustrated in FIG. 3A, substantially the entire square or substantially square spiral coil conductor 32 (two sides in the X-direction and two sides in the Y-direction) overlaps the planar conductor 12B when viewed from the Z-direction. Accordingly, the first region F1 of the antenna device 102B is larger than the first region F1 of the antenna device 101 according to the first preferred embodiment.

As illustrated in FIG. 3A, the device 50 is included inside the wide portion CP2. Examples of the device 50 include terminals, for example, a camera module, a flash, a speaker, an earphone jack, a card slot, and a USB, and devices, for example, a battery cover, a button, and a sensor.

The line width of a portion of the coil conductor 32 in the first region F1 is wider than that in the second region F2. The width (R11 in FIG. 2A) in the radial direction of the coil conductor 32 included in the first region F1 when viewed from the Z-direction is wider than the width (R21 in FIG. 2A) in the radial direction of the coil conductor 32 included in the second region F2 when viewed from the Z-direction (R11>R21). The width (R12 in FIG. 2A) in the radial direction of the coil conductor 32 included in the first region F1 when viewed from the Z-direction is wider than the width (R21) in the radial direction of the coil conductor 32 included in the second region F2 when viewed from the Z-direction (R12>R21). That is, the average radial width (R1) of the coil conductor 32 in the first region F1 is wider than the average radial width (R2) of the coil conductor 32 in the second region F2 (R1>R2).

The number of lines of the coil conductor 32 per unit length (three/R1) in the radial direction of the coil conductor 32 included in the first region F1 when viewed from the Z-direction is less than the number of lines of the coil conductor 32 per unit length (three/R2) in the radial direction of the coil conductor 32 included in the second region F2 when viewed from the Z-direction ((three/R1)<(three/R2)).

Thus, the antenna devices 102 include the same or similar basic structure as in the antenna device 101 according to the first preferred embodiment and provide the same or similar features and effects as in the antenna device 101.

As described in the case of the antenna device 102B, the notch portion (the wide portion CP2 and the slit portion CP1) included in the planar conductor is able to include the device 50 therein.

In the antenna devices 102A and 102B, the coil antenna 42 (coil conductor 32) and the notch portion (the slit portion CP1 or the wide portion CP2) of each of the planar conductors 12A and 12B are coupled with each other with an electric field, a magnetic field, or electromagnetic field located therebetween. Accordingly, in the case where the electric current i0 flows in the first direction (clockwise direction in FIG. 2B) of the coil conductor 32, the electric current i0 causes the electric current i1 to be induced in the planar conductors 12A and 12B and the electric current i1 encloses the notch portion (the slit portion CP1 or the wide portion CP2). However, the notch portion (slit portion CP1) is provided in each of the planar conductors 12A and 12B to extend from the inside toward the outer edge. Accordingly, no eddy current flows through the planar conductors 12A and 12B, and the electric current flows along the outer edge of each of the planar conductors 12A and 12B via the notch portion (slit portion CP1).

As illustrated in FIG. 2B and FIG. 3B, the direction in which the electric current i0 flows through the coil conductor 32 is the same or substantially the same as the direction in which the electric current i1 flows along the outer edge of each of the planar conductors 12A and 12B. Accordingly, in the antenna devices 102A and 102B, the planar conductors 12A and 12B each define and function as a booster antenna for the coil antenna 42 (coil conductor 32).

The first region F1 of each of the antenna devices 102A and 102B is larger than the first region F1 of the antenna device 101 according to the first preferred embodiment as described above. Accordingly, the degree of coupling between the coil antenna 42 (coil conductor 32) of each of the antenna devices 102A and 102B and a corresponding one of the planar conductors 12A and 12B is larger than the degree of coupling between the coil antenna 41 (coil conductor 31) and the planar conductor 11 of the antenna device 101 according to the first preferred embodiment. With the structure described above, however, each first region, in which the inductance per unit length in the circumferential direction of the coil conductor 32 is low, overlaps a corresponding one of the planar conductors 12A and 12B when viewed from the Z-direction, and a variation in the inductance of the coil antenna 42 due to the positional relationships between the planar conductors 12A and 12B and the coil antenna 42 is slight. Accordingly, an antenna device that does not need high dimensional accuracy and high assembly accuracy to enable the inductance of the coil antenna 42 to be prevented from varying is able to be provided.

Third Preferred Embodiment

FIG. 4A is a plan view of an antenna device 103 according to a third preferred embodiment of the present invention, and FIG. 4B is a plan view of the antenna device 103 and illustrates the relationship between an electric current flowing through the coil conductor 32 and an electric current generated in a planar conductor 13.

The antenna device 103 differs from the antenna devices 102A and 102B according to the second preferred embodiment in the shape of the planar conductor 13. The other structures are the same as or similar to the antenna devices 102A and 102B. The differences from the antenna devices 102A and 102B according to the second preferred embodiment will now be described.

The planar conductor 13 is a rectangular or substantially rectangular and flat or substantially flat board conductor including a cavity CP3 with a T-shape when viewed from the Z-direction. As illustrated in FIG. 4A, the coil opening of the coil antenna 42 overlaps the cavity CP3 when viewed from the Z-direction. Accordingly, the antenna device 103 includes the first region F1 in which the coil conductor 32 overlaps the planar conductor 13 when viewed from the Z-direction and the second region F2 in which the coil conductor 32 does not overlap the planar conductor 13 when viewed from the Z-direction. The cavity CP3 is not electrically connected to the outer edge of the planar conductor 13 (the cavity CP3 closes), and accordingly, the electric current i1 flows around the cavity CP3 in the direction opposite the direction in which the electric current i0 flows through the coil antenna 42. However, the cavity CP3 extends to the outer side portion of the region of the coil antenna 42 in which the coil conductor 32 is provided when viewed from the Z-direction, and the electric current i1 flows through a path away from the electric current i0. Accordingly, the magnetic flux produced from the coil conductor 32 passes through the cavity CP3 (portion extending to the outer side portion of the region in which the coil conductor 32 is provided when viewed from the Z-direction). Accordingly, with the structure described above, the magnetic flux produced from the coil conductor 32 of the coil antenna 42 is able to be prevented from being blocked by the planar conductor 13. With the structure described above, the magnetic flux from a coil antenna to be communicated is able to be prevented from being blocked by the planar conductor 13 even in the case where the sender and the receiver are conversed (in the case where the antenna device 103 is a receiving antenna).

The line width of the coil conductor 32 in the first region F1 is wider than the line width of a portion (portion extending in the X-direction) of the coil conductor 32 in the second region F2. That is, the line width of a portion of the coil conductor 32 in the first region F1 is wider than that in the second region F2. The width (R11 in FIG. 4A) in the radial direction of the coil conductor 32 included in the first region F1 when viewed from the Z-direction is wider than the width (R21 in FIG. 4A) in the radial direction of the coil conductor 32 included in the second region F2 when viewed from the Z-direction (R11>R21). The width (R12 in FIG. 4A) in the radial direction of the coil conductor 32 included in the first region F1 when viewed from the Z-direction is wider than the width (R21) in the radial direction of the coil conductor 32 included in the second region F2 when viewed from the Z-direction (R12>R21). That is, the average radial width (R1) of the coil conductor 32 in the first region F1 is wider than the average radial width (R2) of the coil conductor 32 in the second region F2 (R1>R2).

The number of lines of the coil conductor 32 per unit length (three/R1) in the radial direction of the coil conductor 32 included in the first region F1 when viewed from the Z-direction is less than the number of lines of the coil conductor 32 per unit length (three/R2) in the radial direction of the coil conductor 32 included in the second region F2 when viewed from the Z-direction ((three/R1)<(three/R2)).

Accordingly, the structure described above is able to provide the antenna device 103, which does not need high dimensional accuracy and high assembly accuracy to enable the inductance of the coil antenna 42 to be prevented from varying.

Fourth Preferred Embodiment

Figure 5:
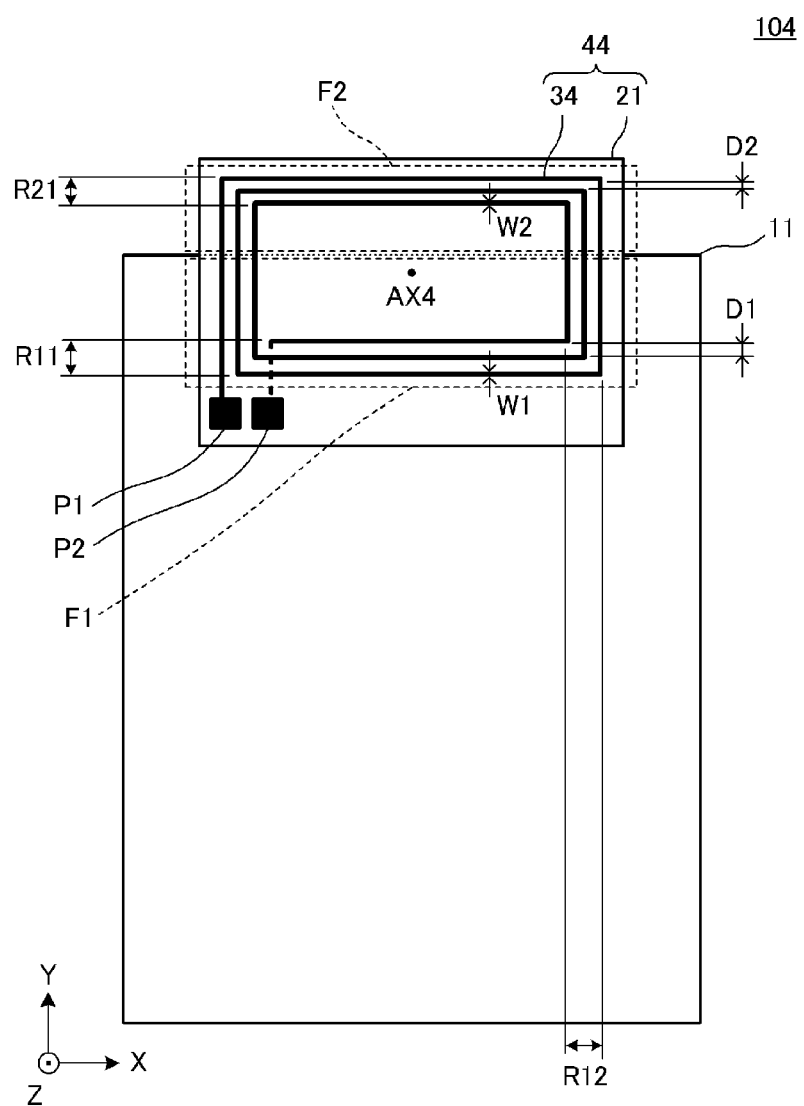
FIG. 5 is a plan view of an antenna device according to a fourth preferred embodiment of the present invention.

FIG. 5 is a plan view of an antenna device 104 according to a fourth preferred embodiment of the present invention.

The antenna device 104 differs from the antenna device 101 according to the first preferred embodiment in the structure of a coil antenna 44 (coil conductor 34). The other structures are the same as or similar to the antenna device 101. The differences from the antenna device 101 according to the first preferred embodiment will now be described.

As illustrated in FIG. 5, the distance (D1 in FIG. 5) between adjoining lines of the coil conductor 34 in the first region F1 is longer than the distance (D2) between adjoining lines of the coil conductor 34 in a portion (portion extending in the X-direction) of the second region F2 (D1>D2). That is, the distance between adjoining lines of a portion of the coil conductor 34 in the first region F1 is longer than that in the second region F2. The line width of the coil conductor 34 of the antenna device 104 is constant or substantially constant. That is, the line width (W1) of the coil conductor 34 in the first region is equal or substantially equal to the line width (W2) of the coil conductor 34 in the second region F2 (D1=D2).

The inductance of a coil in the case where the distance between adjoining lines of the coil conductor is long is typically lower than that in the case where the distance (gap) between adjoining lines of the coil conductor is short. The reason is that an increase in the distance (gap) between lines of the coil conductor decreases the magnetic field coupling between the lines of the coil conductor and decreases the mutual inductance between the lines of the coil conductor. Accordingly, the inductance per unit length in the circumferential direction of the coil conductor 34 in the first region F1 is lower than the inductance per unit length in the circumferential direction of the coil conductor 34 in the second region.

The portion of the coil conductor 34 extending in the X-direction will now be described. The width (R11 in FIG. 5) in the radial direction of the coil conductor 34 included in the first region F1 when viewed from the Z-direction is wider than the width (R21 in FIG. 5) in the radial direction of the coil conductor 34 included in the second region F2 when viewed from the Z-direction (R11>R21). A portion of the coil conductor 34 extending in the Y-direction will now be described. The width (R12 in FIG. 5) in the radial direction of the coil conductor 34 included in the first region F1 when viewed from the Z-direction is equal or substantially equal to the width (R12) in the radial direction of the coil conductor 34 included in the second region F2 when viewed from the Z-direction. That is, the average radial width (R1) of the coil conductor 34 in the first region F1 is wider than the average radial width (R2) of the coil conductor 34 in the second region F2 (R1>R2).

The number of lines of the coil conductor 34 per unit length (three/R1) in the radial direction of the coil conductor 34 included in the first region F1 when viewed from the Z-direction is less than the number of lines of the coil conductor 34 per unit length (three/R2) in the radial direction of the coil conductor 34 included in the second region F2 when viewed from the Z-direction ((three/R1)<(three/R2)).

With the structure described above, the first region, in which the inductance per unit length in the circumferential direction of the coil conductor 34 is low, overlaps the planar conductor 11 when viewed from the Z-direction, and a variation in the inductance of the coil antenna 44 due to the positional relationships between the planar conductor 11 and the coil antenna 44 is slight. Accordingly, the antenna device 104 according to the present preferred embodiment provides the same or similar features and effects as in the antenna device 101.

Fifth Preferred Embodiment

Figure 6:
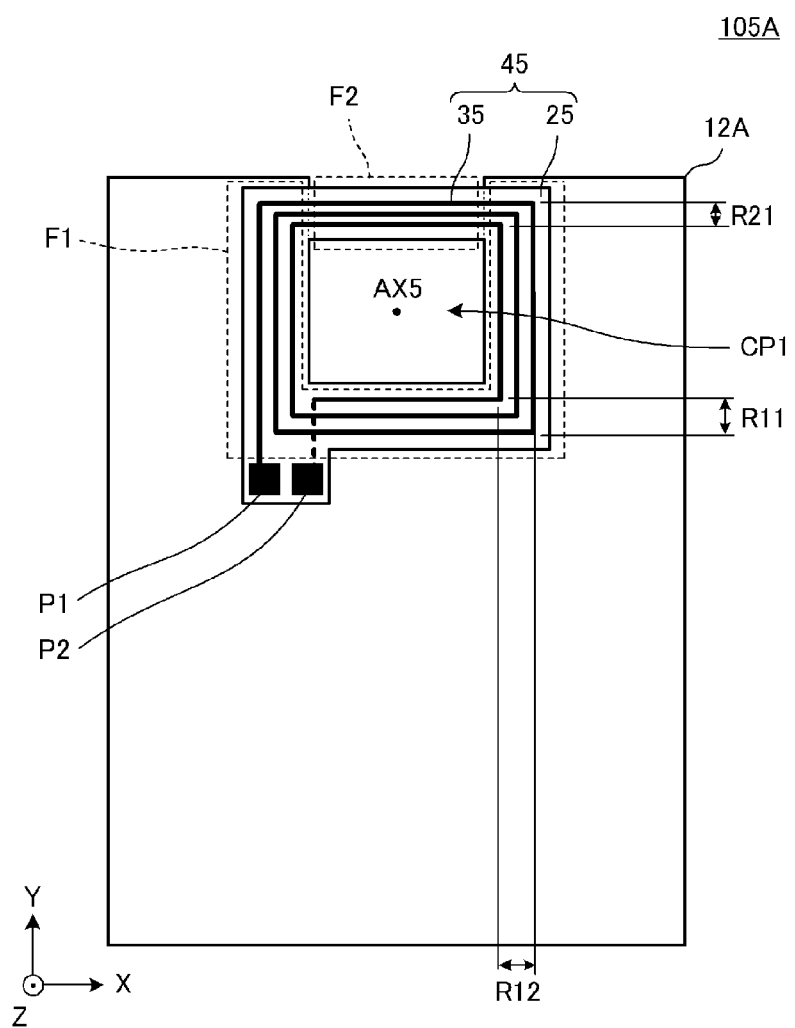
FIG. 6 is a plan view of an antenna device according to a fifth preferred embodiment of the present invention.
Figure 7:
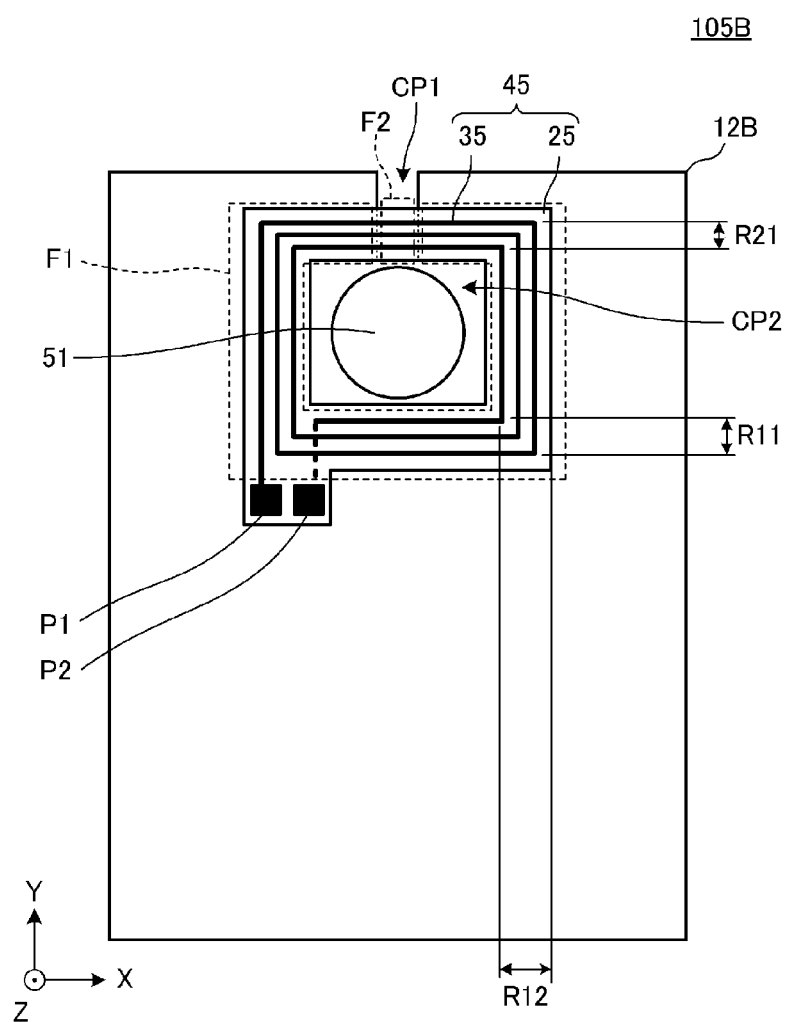
FIG. 7 is a plan view of an antenna device according to the fifth preferred embodiment of the present invention.

FIG. 6 is a plan view of an antenna device 105A according to a fifth preferred embodiment of the present invention. FIG. 7 is a plan view of an antenna device 105B according to the fifth preferred embodiment.

The antenna devices 105A and 105B differ from the antenna devices 102A and 102B according to the second preferred embodiment in the shape of a substrate 25 of a coil antenna 45. The other structures are the same as or similar to the antenna devices 102A and 102B. The differences from the antenna devices 102A and 102B according to the second preferred embodiment will now be described.

A coil conductor 35 is a square or substantially square spiral conductor pattern wound around a winding axis AX5. The substrate 25 of the coil antenna 45 is a flat or substantially flat board including the same or substantially the same shape (L-shape) as the external shape of the coil conductor 35 and the electrodes P1 and P2. The substrate 25 includes a rectangular or substantially rectangular opening at a position corresponding to the coil opening of the coil conductor 35.

The coil opening of the coil antenna 45 of the antenna device 105A overlaps the slit portion CP1 when viewed from the Z-direction. The coil antenna 45 of the antenna device 105B overlaps the wide portion CP2. Accordingly, as illustrated in FIG. 6 and FIG. 7, the antenna devices 105A and 105B include the first region F1 in which each coil conductor 35 overlaps a corresponding one of the planar conductors 12A and 12B when viewed from the Z-direction and the second region F2 in which the coil conductor 35 does not overlap the planar conductors 12A and 12B when viewed from the Z-direction.

The distance between lines of a portion of the coil conductor 35 in the first region F1 is longer than that in the second region F2. Accordingly, the inductance per unit length in the circumferential direction of the coil conductor 35 in the first region F1 is lower than the inductance per unit length in the circumferential direction of the coil conductor 35 in the second region.

The width (R11 in FIG. 6) in the radial direction of the coil conductor 35 included in the first region F1 when viewed from the Z-direction is wider than the width (R21 in FIG. 6) in the radial direction of the coil conductor 35 included in the second region F2 when viewed from the Z-direction (R11>R21). The width (R12 in FIG. 6) in the radial direction of the coil conductor 35 included in the first region F1 when viewed from the Z-direction is wider than the width (R21) in the radial direction of the coil conductor 35 included in the second region F2 when viewed from the Z-direction (R12>R21). That is, the average radial width (R1) of the coil conductor 35 in the first region F1 is wider than the average radial width (R2) of the coil conductor 35 in the second region F2 (R1>R2).

The number of lines of the coil conductor 35 per unit length (three/R1) in the radial direction of the coil conductor 35 included in the first region F1 when viewed from the Z-direction is less than the number of lines of the coil conductor 35 per unit length (three/R2) in the radial direction of the coil conductor 35 included in the second region F2 when viewed from the Z-direction ((three/R1)<(three/R2)).

Thus, the antenna devices 105A and 105B include the same or similar basic structure as in the antenna devices 102A and 102B according to the second preferred embodiment and provide the same or similar features and effects as in the antenna devices 102A and 102B.

Sixth Preferred Embodiment

Figure 8:
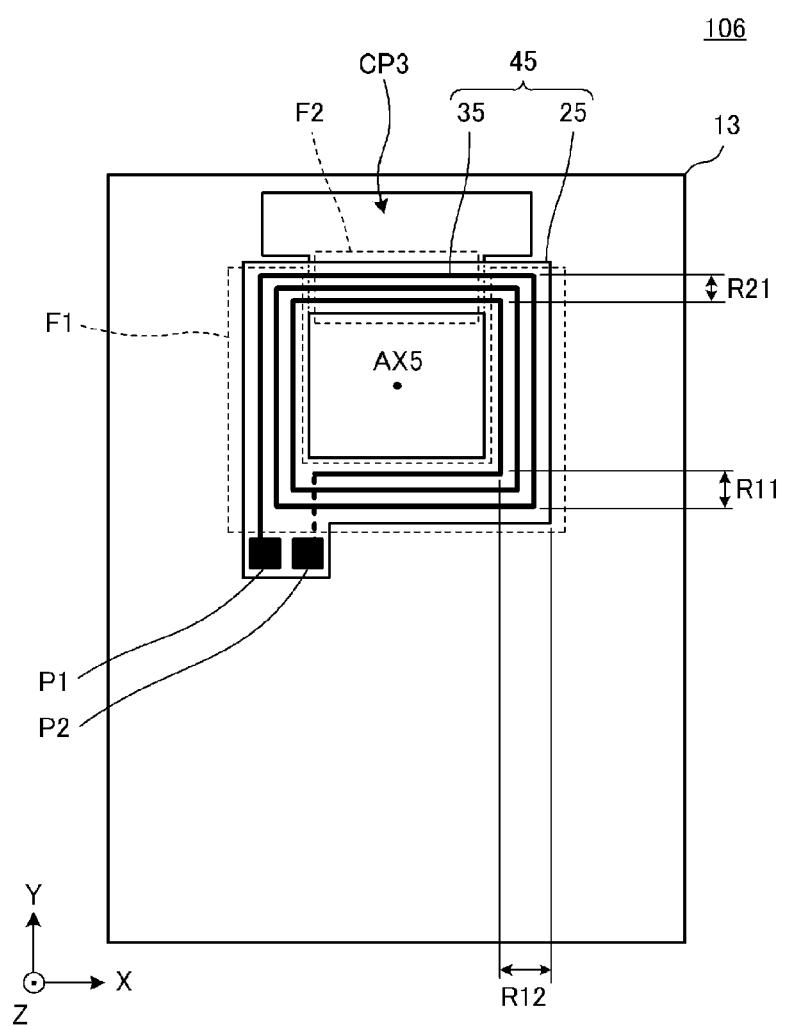

FIG. 8 is a plan view of an antenna device 106 according to a sixth preferred embodiment of the present invention.

The antenna device 106 differs from the antenna device 103 according to the third preferred embodiment in the structure of the coil antenna 45. The other structures are the same as or similar to the antenna device 103. The coil antenna 45 according to the sixth preferred embodiment is the same as or similar to the coil conductor 45 described according the fifth preferred embodiment.

As described in FIG. 8, the coil opening of the coil antenna 45 overlaps a portion of the cavity CP3 when viewed from the Z-direction. Accordingly, the antenna device 106 includes the first region F1 in which the coil conductor 35 overlaps the planar conductor 13 when viewed from the Z-direction and the second region F2 in which the coil conductor 35 does not overlap the planar conductor 13 when viewed from the Z-direction.

Thus, the antenna device 106 includes the same or similar basic structure as in the antenna device 103 according to the third preferred embodiment and provide the same or similar features and effects as in the antenna device 103.

Seventh Preferred Embodiment

FIG. 9A is a plan view of an antenna device 107 according to a seventh preferred embodiment of the present invention, and FIG. 9B is a sectional view of the antenna device 107.

The antenna device 107 differs from the antenna device 101 according to the first preferred embodiment in a coil antenna (a magnetic member 1 is also included, and the shape of a coil conductor 37 is different). The other structures are the same as or similar to the antenna device 101. The differences from the antenna device 101 according to the first preferred embodiment will now be described.

The coil antenna 47 includes the substrate 21, the coil conductor 37, the electrodes P1 and P2, and the magnetic member 1. The magnetic member 1 is a rectangular or substantially rectangular and flat or substantially flat board and includes the same or substantially the same planar shape as in the substrate 21. The magnetic member 1 is attached on one main surface side of the substrate 21. An example of the magnetic member 1 is a resin sheet in which magnetic material powder, for example, ferrite powder is dispersed in a resin, for example, an epoxy resin.

As illustrated in FIGS. 9A and 9B, the line width (W1) of the coil conductor 37 in the first region F1 is wider than the line width (W2) of a portion (portion extending in the X-direction) of the coil conductor 37 in the second region F2 (W1>W2). That is, the line width of a portion of the coil conductor 37 in the first region F1 is wider than that in the second region F2.

The distance (D1) between lines of the coil conductor 37 in the first region F1 is longer than the distance (D2) of lines of the coil conductor 37 in the second region F2 (D1>D2). That is, the distance between lines of a portion of the coil conductor 37 in the first region F1 is longer than that in the second region F2.

Accordingly, the inductance per unit length in the circumferential direction of the coil conductor 37 in the first region F1 is lower than the inductance per unit length in the circumferential direction of the coil conductor 37 in the second region F2.

Thus, the antenna device 107 includes the same or similar basic structure as in the antenna device 101 according to the first preferred embodiment and provides the same or similar features and effects as in the antenna device 101.

In the antenna device 107 according to the present preferred embodiment, the concentrating effect of the magnetic member 1 enhances the magnetic field coupling with an antenna to be communicated. Since the coil antenna 47 includes the magnetic member 1, a predetermined inductance is able to be provided without increasing the size. In addition, the magnetic member 1 enables a magnetism shield effect to be provided on one main surface of the substrate 21.

Eighth Preferred Embodiment

FIG. 10A is a plan view of an antenna device 108A according to an eighth preferred embodiment of the present invention, and FIG. 10B is a plan view of a coil antenna 48A that the antenna device 108A includes. In FIGS. 10A and 10B, a coil conductor 38B provided on the back surface of a substrate is illustrated by a texture pattern for clarity of the structure.

The antenna device 108A includes the planar conductor 12A and the coil antenna 48A. The planar conductor 12A according to the eighth preferred embodiment is the same as or similar to the planar conductor 12A described according to the second preferred embodiment. The coil antenna 48A includes the substrate 28, two coil conductors 38A and 38B, interlayer connection conductors (not illustrated), and the electrodes P1 and P2. The substrate 28 is a rectangular or substantially rectangular and flat or substantially flat board including an insulating material.

The coil conductor 38A is provided on one main surface (front surface of the substrate 28 in FIG. 10A) of the substrate 28 and is a rectangular or substantially rectangular spiral conductor pattern wound around a winding axis AX8 at about two turns. The coil conductor 38B is provided on the other main surface (back surface of the substrate 28 in FIG. 10A) of the substrate 28 and is a rectangular or substantially rectangular spiral conductor pattern wound around the winding axis AX8 at about two turns. One end of the coil conductor 38A is electrically connected to the electrode P1 provided on the one main surface of the substrate 28. The other end of the coil conductor 38A is electrically connected to one end of the coil conductor 38B provided on the other main surface of the substrate 28 with the interlayer connection conductor, not illustrated, located therebetween. The other end of the coil conductor 38B is electrically connected to the electrode P2 provided on the one main surface of the substrate 28 with an interlayer connection conductor, not illustrated, located therebetween.

The coil antenna 48A and the planar conductor 12A of the antenna device 108A partially overlap when viewed from the Z-direction. Accordingly, the coil antenna 48A includes the first region F1 in which the coil conductors 38A and 38B overlap the planar conductor 12A when viewed from the Z-direction and the second region F2 in which the coil conductors 38A and 38B do not overlap the planar conductor 12A when viewed from the Z-direction.

As illustrated in FIGS. 10A and 10B, the distance D1A between adjoining lines of the coil conductor 38A in the first region F1 is equal or substantially equal to the distance D2A between adjoining lines of the coil conductor 38A in the second region F2 (D1A=D2A). The distance D1B between adjoining lines of the coil conductor 38B in the first region F1 is equal or substantially equal to the distance D2B between adjoining lines of the coil conductor 38B in the second region F2 (D1B=D2B). That is, in the coil antenna 48A according to the present preferred embodiment, the distances between adjoining lines of the coil conductor located in a single layer are equal or substantially equal to each other regardless of the first region F1 and the second region F2.

The width (R11 in FIG. 10A) in the radial direction of the coil conductors 38A and 38B included in the first region F1 when viewed from the Z-direction is wider than the width (R21 in FIG. 10A) in the radial direction of the coil conductors 38A and 38B included in the second region F2 when viewed from the Z-direction (R11>R21). The width (R12 in FIG. 10A) in the radial direction of the coil conductors 38A and 38B included in the first region F1 when viewed from the Z-direction is wider than the width (R21) in the radial direction of the coil conductors 38A and 38B included in the second region F2 when viewed from the Z-direction (R12>R21). That is, the average radial width (R1) of the coil conductors 38A and 38B in the first region F1 is wider than the average radial width (R2) of the coil conductors 38A and 38B in the second region F2 (R1>R2).

The "average radial width of the coil conductors in the first region" in the case where the coil conductors are provided in layers as in the coil antenna 48A according to the present preferred embodiment indicates the average value of the width in the radial direction of the coil conductors included in the first region F1 when viewed from the Z-direction (direction of the winding axis AX8). The "average radial width of the coil conductors in the second region" in the case where the coil conductors are provided in layers indicates the average value of the width in the radial direction of the coil conductors included in the second region F2 when viewed from the Z-direction (direction of the winding axis AX8).

The number of lines of the coil conductors 38A and 38B per unit length (four/R1) in the radial direction of the coil conductors 38A and 38B included in the first region F1 when viewed from the Z-direction is less than the number of lines of the coil conductors 38A and 38B per unit length (four/R2) in the radial direction of the coil conductors 38A and 38B included in the second region F2 when viewed from the Z-direction ((four/R1)<(four/R2)).

Accordingly, the inductance per unit length in the circumferential direction of the coil conductors 38A and 38B in the first region F1 is lower than the inductance per unit length in the circumferential direction of the coil conductors 38A and 38B in the second region.

An antenna device the structure of which partially differs from that of the antenna device 108A will now be described. FIG. 11A is a plan view of another antenna device 108B according to the eighth preferred embodiment, and FIG. 11B is a plan view of a coil antenna 48B that the antenna device 108B includes. In FIGS. 11A and 11B, the coil conductor 38B provided on the back surface of the substrate 28 is illustrated by a texture pattern for clarity of the structure.

The antenna device 108B differs from the antenna device 108A in the structure of the coil conductors 38A and 38B. The other structures are the same or substantially the same as the antenna device 108A.

The antenna device 108B includes the planar conductor 12A and the coil antenna 48B. The coil antenna 48B includes the substrate 28, the coil conductors 38A and 38B, the interlayer connection conductors (not illustrated), and the electrodes P1 and P2.

As illustrated in FIGS. 11A and 11B, the coil conductors 38A and 38B in the second region F2 partially overlap when viewed from the Z-direction. In other words, with respect to a complete coil conductor of the coil antenna 48B, a first portion (portion of the coil conductor 38A) of the complete coil conductor overlaps a second portion (portion of the coil conductor 38B) of the complete coil conductor in the second region F2.

Even with the structure described above, the average radial width (R1) of the coil conductors 38A and 38B in the first region F1 is wider than the average radial width (R2) of the coil conductors 38A and 38B in the second region F2 (R1>R2). The number of lines of the coil conductors 38A and 38B per unit length (four/R1) in the radial direction of the coil conductors 38A and 38B included in the first region F1 when viewed from the Z-direction is less than the number of lines of the coil conductors 38A and 38B per unit length (four/R2) in the radial direction of the coil conductors 38A and 38B included in the second region F2 when viewed from the Z-direction ((four/R1)<(four/R2)). Accordingly, the inductance per unit length in the circumferential direction of the coil conductors 38A and 38B in the first region F1 is less than the inductance per unit length in the circumferential direction of the coil conductors 38A and 38B in the second region.

In examples described according to the present preferred embodiments, the coil antenna includes the two coil conductors 38A and 38B but is not limited to the structure described above. The number of the coil conductors that the coil antenna includes is able to be appropriately changed within the range in which the features and effects of the preferred embodiments of the present invention are provided. The coil antenna may include three or more coil conductors.

As in the present preferred embodiment, the coil conductors may not be included on the same plane. Although the coil antenna including the coil conductors provided on the front and back surfaces of the substrate 28 is described according to the present preferred embodiment, the coil antenna is not limited to the structure described above. For example, in the case where the coil antenna includes a multilayer body with stacked substrate layers, the coil conductors may be included in the respective substrate layers, or two or more coil conductors may be included in a single substrate layer.

The "distance between adjoining lines of the coil conductors" in the case where the coil conductors are provided in layers will now be described with reference to drawings. FIG. 12A is an enlarged sectional view of the antenna device 108A in the second region, and FIG. 12B is an enlarged sectional view of the antenna device 108B in the second region.

According to the preferred embodiments of the present invention, the "distance between adjoining lines of the coil conductors" corresponds to a gap between lines of the coil conductors that are closest to each other. That is, the "distance between adjoining lines of the coil conductors" corresponds to the smallest gap among gaps corresponding to the distances (for example, the distances D2A and D2B in FIGS. 12A and 12B) between lines of the coil conductors that are close to each other on the same or substantially the same plane (XY plane) and the distances (for example, the distance D3 in FIGS. 12A and 12B) between lines of the coil conductors that are close to each other on different planes.

As illustrated in FIG. 12A, for example, in the case of the second region of the antenna device 108A, the "distance between adjoining lines of the coil conductors" is the distance D3 between adjoining lines of the coil conductor 38A and the coil conductor 38B. As illustrated in FIG. 12B, for example, in the case of the second region of the antenna device 108B, the "distance between adjoining lines of the coil conductors" is the distance S4 between adjoining lines of the coil conductor 38A and the coil conductor 38B.

Ninth Preferred Embodiment

FIG. 13 is a plan view of the inner structure of a housing of an electronic device according to a ninth preferred embodiment of the present invention.

Examples of the electronic device include cellular phones (including a smart phone and a feature phone), wearable terminals (for example, a smart watch and smart glasses), a notebook computer, a tablet terminal, a PDA, a camera, a game console, a toy, and information media, for example, a RFID tag, an IC tag, a SD (registered trademark) (Secure Digital) card, a SIM card, and an IC card.

The electronic device according to the ninth preferred embodiment includes an antenna device 102C, radiating elements 81 and 82 of a standing wave antenna, an upper housing 91, and a lower housing 92.

The antenna device 102C includes a planar conductor 12C and a coil antenna 42C. The coil antenna 42C is the same or substantially the same as the coil antenna 42 described according to the second preferred embodiment. The planar conductor 12C includes a slit portion CP4 (notch portion) extending from the inside toward the outer edge. The planar conductor 12C is a conductor that includes a shape (U-shape) including a dent when viewed from the Z-direction and that includes a shape (U-shape) including a dent when viewed from the longitudinal direction (Y-direction in FIG. 13). As illustrated in FIG. 13, the coil opening of the coil antenna 42C overlaps the slit portion CP4 of the planar conductor 12C when viewed from the Z-direction.

The planar conductor 12C of the antenna device 102C and the radiating elements 81 and 82 of the standing wave antenna defines a portion of the lower housing 92 of the electronic device. As illustrated in FIG. 13, in the lower housing 92, the radiating element 81 of the standing wave antenna, the antenna device 102C, and the radiating element 82 of the standing wave antenna are provided in this order in the longitudinal direction (Y-direction) with gaps S1 and S2 located therebetween.

A device 63, circuit boards 71 and 72, and a battery pack 64, for example, are accommodated in the upper housing 91. A first power-supply circuit 61, second power-supply circuits 67 and 68, reactive elements 65 and 66, a capacitor 62, and contact pins 51 and 52, for example, are mounted on the circuit board 72.

As illustrated in FIG. 13, the device 63 is included inside the slit portion CP4. Examples of the device 63 include terminals, for example, a camera module, a flash, a speaker, an earphone jack, a card slot, and a USB, and devices, for example, a battery cover, a button, and a sensor.

As illustrated in FIG. 13, the first power-supply circuit 61 is electrically connected to both ends (electrodes P1 and P2) of a coil conductor 32C with the contact pins 51 and 52, for example, located therebetween. The capacitor 62 is electrically connected to the coil conductor 32C in parallel. An LC resonant circuit is defined by the coil conductor 32C, the capacitor 62, and a capacitance component of first power-supply circuit 61. With the structure described above, the coil conductor 32C is coupled with the planar conductor 12C, and the planar conductor 12C defines and functions as a booster antenna for the coil conductor 32C. An example of the first power-supply circuit 61 is a RFIC element for NFC at 13.56 MHz. An example of the capacitor 62 is a chip capacitor for the resonant circuit. An example of the contact pins 51 and 52 is a movable probe pin.

The second power-supply circuit 67 is electrically connected to the radiating element 81 of the standing wave antenna with the reactive element 65 and a cable 74 located therebetween. The second power-supply circuit 68 is electrically connected to the radiating element 82 of the standing wave antenna with the reactive element 66 located therebetween. Each of the second power-supply circuits 67 and 68 is a UHF-band IC or an SHF-band IC, and examples thereof include a power-supply circuit of a communication system for a GPS at 1.5 GHz band and a power-supply circuit of a communication system for a wireless LAN at a 2.4 GHz band. An example of the reactive elements 65 and 66 is an electronic component, for example, a chip capacitor.

The structure described above is able to provide an electronic device that includes the antenna device 102C, which does not need high dimensional accuracy and high assembly accuracy to enable the inductance of the coil antenna 42C to be prevented from varying even in the case where the coil antenna 42C and the planar conductor 12C overlap.

In the electronic device according to the present preferred embodiment, since the planar conductor 12C is a portion of the housing, the antenna device 102C is able to be easily produced. That is, it is not necessary to separately form the planar conductor 12C, and thus manufacture thereof is easy, and the cost thereof is able to be decreased. In an example described according to the present preferred embodiment, the planar conductor 12C of the antenna device 102C is a portion of the housing but is not limited thereto. Another planar conductor may be provided, and a conductor pattern (for example, a ground conductor) provided on the circuit board accommodated in the housing may be included.

The notch portion (slit portion CP4) included in the planar conductor is able to include the device 63 therein as described for the electronic device according to the present preferred embodiment. In an example described for the antenna device 102C, the device 63 is included in the notch portion (slit portion CP4). However, the notch portion (slit portion CP4) and the gaps S1 and S2 may be covered with a resin.

According to the present preferred embodiment, the electronic device includes a rectangular cuboid or substantially rectangular cuboid shape but is not limited thereto. The shape of the electronic device is able to be appropriately changed.

Tenth Preferred Embodiment

FIG. 14 is a plan view of the inner structure of a housing of an electronic device according to a tenth preferred embodiment of the present invention. FIG. 15 is a plan view of an upper housing 91A that the electronic device according to the tenth preferred embodiment includes. FIG. 15 illustrates the position of a coil conductor 32D that a coil antenna 42D includes when the upper housing and a lower housing are combined for clarity of the structure of the electronic device.

The electronic device according to the tenth preferred embodiment illustrated in FIG. 14 includes an antenna device, the upper housing 91A, and a lower housing 92A.

Devices 63A, 63B, and 63C, a circuit board 73, and the battery pack 64, for example, are accommodated in the upper housing 91A. UHF-band antennas 83 and 84, the first power-supply circuit 61, the capacitor 62, and the contact pins 51 and 52, for example, are mounted on the circuit board 73. A ground conductor 14 is provided in the inside of the circuit board 73. The device 63A is included inside one of notch portions included in the circuit board 73. An example of the device 63A is a front camera located on a display side. An example of the device 63B is a rear camera located on a back surface side. An example of the device 63C is an earphone jack. An example of the UHF-band antennas 83 and 84 is an antenna implemented for, for example, a cellular system, a GPS (Global Positioning System), Wi-Fi (registered trademark) or Bluetooth (registered trademark).

According to the present preferred embodiment, the ground conductor 14 included in the inside of the circuit board 73 corresponds to a "planar conductor".

The coil antenna 42D is attached to the inside of the lower housing 92A. The lower housing 92A includes a hole 93 for a rear camera. The coil antenna 42D is the same or substantially the same as the coil antenna 42 described according to the second preferred embodiment.

The antenna device according to the present preferred embodiment includes the coil antenna 42D and the ground conductor 14 (planar conductor). The ground conductor 14 is a planar conductor including the notch portions at portions at which the devices 63A, 63B, and 63C are located when viewed from the Z-direction. As illustrated in FIG. 15, the coil opening of the coil antenna 42D overlaps the device 63A when viewed from the Z-direction. When the upper housing 91A and the lower housing 92A are combined, a portion of the coil conductor 32D of the coil antenna 42D overlaps the ground conductor 14 when viewed from the Z-direction. Accordingly, the coil antenna 42D includes the first region F1 in which the coil conductor 32D overlaps the ground conductor 14 when viewed from the Z-direction and the second region F2 in which the coil conductor 32D does not overlap the ground conductor 14 when viewed from the Z-direction.

The first power-supply circuit 61 is electrically connected to both ends (electrodes P1 and P2) of the coil conductor 32D with the contact pins 51 and 52, for example, located therebetween. The capacitor 62 is electrically connected to the coil conductor 32D in parallel. With structure described above, the coil conductor 32D is coupled with the ground conductor 14, and the ground conductor 14 defines and functions as a booster antenna for the coil conductor 32D.

Thus, the conductor pattern (ground conductor) included in the inside of the circuit board 73, for example, is able to be included as the planar conductor.

In an example described according to the present preferred embodiment, the coil antenna is attached to the lower housing of the electronic device but is not limited thereto. The coil antenna may be attached to the housing or may be secured to, for example, an inner cover located between the circuit board and the housing.

Eleventh Preferred Embodiment

FIG. 16 is a plan view of the inner structure of a housing of an electronic device according to an eleventh preferred embodiment of the present invention. FIG. 17 is a plan view of an upper housing 91B that the electronic device according to the eleventh preferred embodiment includes.

FIG. 17 illustrates the position of the coil conductor 32D that a coil antenna 42E includes when the upper housing and a lower housing are combined for clarity of the structure of the electronic device.

The structure of the electronic device according to the present preferred embodiment differs from that of the electronic device according to the tenth preferred embodiment in the structure, features, and elements of the coil conductor. The other structures are the same or substantially the same as in the electronic device according to the tenth preferred embodiment.

The coil antenna 42E is attached to the inside of a lower housing 92B. The coil antenna 42E differs from the above coil antenna 42D in including a hole 94. The other structures are the same or substantially the same as in the coil antenna 42D.

The hole 94 of the coil antenna 42E is provided at the coil opening of the coil antenna 42E and includes the same or substantially the same shape as in the hole 93 for the rear camera that is provided in the lower housing 92B. The coil antenna 42E is attached to the inside of the lower housing 92B and the hole 94 of the coil antenna 42E matches the hole 93 for the rear camera that is provided in the lower housing 92B.

The antenna device according to the present preferred embodiment includes the coil antenna 42E and the ground conductor 14. The hole 94 of the coil antenna 42E and the hole 93 for the rear camera overlap the device 63B when viewed from the Z-direction.

Twelfth Preferred Embodiment

FIG. 18 is a plan view of the inner structure of a housing of an electronic device according to a twelfth preferred embodiment of the present invention. FIG. 19 is a plan view of an upper housing 91C that the electronic device according to the twelfth preferred embodiment includes. FIG. 19 illustrates the position of the coil conductor 32D that the coil antenna 42D includes when the upper housing and a lower housing are combined for clarity of the structure of the electronic device.

The electronic device according to the present preferred embodiment differs from the electronic device according to the tenth preferred embodiment in including a shield case mounted on the circuit board. The electronic device according to the present preferred embodiment also differs from the electronic device according to the tenth preferred embodiment in the shape of the ground conductor 14. The other structures are the same or substantially the same as in the electronic device according to the tenth preferred embodiment.

The UHF-band antennas 83 and 84, the first power-supply circuit 61, a shield case 15, the capacitor 62, and the contact pins 51 and 52, for example, are mounted on the circuit board 73. Ground conductors 14A and 14B are included in the circuit board 73. An example of the shield case 15 is a metallic cover that is mounted on the circuit board and that accommodates, for example, an integrated circuit.

According to the present preferred embodiment, the shield case 15 mounted on the circuit board 73 and the ground conductor 14B included in the inside of the circuit board 73 each correspond to a "planar conductor".

The coil antenna 42D is attached to the inside of a lower housing 92C.

The antenna device according to the present preferred embodiment includes the coil antenna 42D and the shield case 15 (planar conductor). Each of the ground conductors 14A and 14B is a flat or substantially flat board conductor including a rectangular planar or substantially rectangular planar shape. The shield case 15 is a conductor including notch portions at positions at which the devices 63A and 63B are located when viewed from the Z-direction. As illustrated in FIG. 19, the coil opening of the coil antenna 42D overlaps the device 63A when viewed from the Z-direction. When the upper housing 91C and the lower housing 92C are combined, a portion of the coil conductor 32D of the coil antenna 42D overlaps the shield case 15 and the ground conductor 14B when viewed from the Z-direction. Accordingly, the coil antenna 42D includes the first region F1 in which the coil conductor 32D overlaps the shield case 15 and the ground conductor 14 when viewed from the Z-direction and the second region F2 in which the coil conductor 32D does not overlap the shield case 15 and the ground conductor 14 when viewed from the Z-direction.

Thus, the shield case 15 mounted on the circuit board 73 and the ground conductor 14 included in the inside of the circuit board 73 may be included as the planar conductors. Components included as the planar conductors are not limited to the conductor pattern, for example, the ground conductor, and the shield case and may be a conductive shield provided on the back surface of a display and a battery pack. As described according to the present preferred embodiment, the antenna device may include the planar conductors.

In addition to the camera described according to the preferred embodiments, terminals, for example, a flash, a speaker, an earphone jack, a card slot, and a USB, and mechanical components, for example, a battery cover, a button, a sensor, and a mechanical switch may be included inside the notch portions of the circuit board 73 and the planar conductor.

Thirteenth Preferred Embodiment

FIG. 20 is a plan view of the inner structure of a housing of an electronic device according to a thirteenth preferred embodiment of the present invention. FIG. 21 is a plan view of an upper housing 91D that the electronic device according to the thirteenth preferred embodiment includes. FIG. 21 illustrates the position of the coil conductor 32D that a coil antenna 42F includes when the upper housing and a lower housing are combined for clarity of the structure of the electronic device.

The electronic device according to the present preferred embodiment differs from the electronic device according to the eleventh preferred embodiment in, for example, the structure of the coil antenna. The electronic device according to the present preferred embodiment also differs from the electronic device according to the eleventh preferred embodiment in including a power-supply coil 54. The other structures are the same or substantially the same as in the electronic device according to the eleventh preferred embodiment.

The coil antenna 42F is attached to the inside of a lower housing 92D. A connector element 69 electrically connects both ends of the coil conductor 32D of the coil antenna 42F to each other. An example of the connector element 69 is a conductor pattern provided on the front surface of a substrate 22E.

The UHF-band antennas 83 and 84, the first power-supply circuit 61, the capacitor 62, and the power-supply coil 54, for example, are mounted on the circuit board 73.

As illustrated in FIG. 20, input and output terminals of the first power-supply circuit 61 are electrically connected to the power-supply coil 54. The capacitor 62 is electrically connected to the power-supply coil 54 in parallel. An LC resonant circuit is defined by the power-supply coil 54, the capacitor 62, and a capacitance component of first power-supply circuit 61 itself. Magnetic field coupling between the first power-supply circuit 61 and the coil conductor 32D of the coil antenna 42F occurs with the power-supply coil 54 located therebetween.

Thus, the coil conductor of the coil antenna may be electrically connected to the power-supply circuit by using magnetic field coupling.

In an example described according to the present preferred embodiment, the connector element 69 preferably is the conductor pattern provided on the front surface of the substrate 22E but is not limited to the structure described above. The connector element 69 may be, for example, a capacitor for resonance.

Other Preferred Embodiments

In examples described according to the above preferred embodiments, the substrate of the coil antenna preferably is a flat or substantially flat board that includes a rectangular or substantially rectangular shape, an L-shape, or another shape but is not limited thereto. The planar shape of the substrate of the coil antenna is able to be appropriately changed into, for example, a square or substantially square shape, a polygonal shape, a T-shape, a Y-shape, a circular or substantially circular shape, or an elliptical shape. The substrate is not limited to a flat or substantially flat board and may include, for example, a three-dimensional structure. The substrate is not essential for the antenna devices according to the preferred embodiments of the present invention as described later.

In examples described according to the above preferred embodiments, the coil antenna preferably includes the rectangular or substantially rectangular spiral coil conductor or the square or substantially square spiral coil conductor but is not limited thereto. The coil antenna (coil conductor) may include a polygonal spiral shape, a circular or substantially circular spiral shape, an elliptical spiral shape, or a helical shape. The coil antenna may be a helical multilayer coil antenna including stacked substrates on which spiral coil conductors are provided. The coil antenna may be a winding coil. That is, the substrate of the coil antenna is not essential.

In examples described according to the above preferred embodiments, the winding axis of the coil conductor preferably is parallel or substantially parallel to the Z-direction (direction perpendicular or substantially perpendicular to a main surface of the planar conductor) but preferred embodiments of the present invention are not limited to this specific structure. The winding axis of the coil conductor may be directed to any direction provided that the first region, in which the inductance per unit length in the circumferential direction of the coil conductor is low, overlaps the planar conductor when viewed from the Z-direction.

In examples described according to the above preferred embodiments, the planar conductor preferably is a flat or substantially flat board including, for example, a rectangular or substantially rectangular shape or a square or substantially square shape but is not limited thereto. The planar shape of the planar conductor is able to be appropriately changed into, for example, a polygonal shape, an L-shape, a T-shape, a circular or substantially circular shape, or an elliptical shape. The planar conductor is not limited to the flat or substantially flat board and may include a three-dimensional structure as described according to the ninth and twelfth preferred embodiments. Each main surface of the planar conductor is not limited to a flat or substantially flat surface and may be a curved surface.

In examples described according to the above preferred embodiments, the antenna device preferably includes one planar conductor but is not limited thereto. As described according to the twelfth preferred embodiment, the antenna devices according to the preferred embodiments of the present invention may include the planar conductors provided that the first region, in which the inductance per unit length in the circumferential direction of the coil conductor is low, overlaps the planar conductor when viewed from the Z-direction.

In examples described according to the above preferred embodiments, the planar conductor preferably includes the polygonal notch portions but is not limited thereto. The shape and number of the notch portions that the planar conductor includes, for example, is able to be appropriately changed. In examples described according to the above preferred embodiments, the planar conductor includes the notch portions extending in a direction of a plane (XY plane) but is not limited thereto. A planar conductor with a three-dimensional structure may include a notch portion extending in a plane (XY plane) direction and a thickness (Z-direction) direction.

In examples described according to the above preferred embodiments, the coil antenna (coil conductor) preferably is directly and electrically connected to the power-supply circuit but is not limited thereto. As described according to the thirteenth preferred embodiment, the coil antenna (coil conductor) may be connected to the power-supply circuit by coupling the power-supply circuit with the coil antenna (coil conductor) by an electric field, a magnetic field, or an electromagnetic field located therebetween.

In examples described according to the above preferred embodiments, each antenna device and each electronic device preferably are able to be included in a communication system that includes magnetic field coupling, for example, NFC. According to the above preferred embodiments, each antenna device and each electronic device may also be included in a non-contact power transmission system (an electromagnetic induction method or a magnetic resonance method) that includes the magnetic field coupling.

That is, each of the antenna devices according to the above preferred embodiments is able to be implemented, for example, as a receiving antenna device of a power receiver or a transmitting antenna device of a power transmitter in the non-contact power transmission system with the magnetic resonance method at a HF band (particularly, at 6.78 MHz or near 6.78 MHz). The antenna device is connected to a power-supply circuit (receiving circuit) that supplies power to a load (for example, a secondary battery) with which the power receiver is equipped. Also in this case, the coil antenna and the planar conductor define and function as a transmitting antenna device or a receiving antenna device. Both ends of the coil conductor that the coil antenna of the antenna device includes are connected to the receiving circuit or a transmitting circuit that adjusts the communication frequency band (HF band, particularly, at 6.78 MHz or near 6.78 MHz). In particular, in the non-contact power transmission system with the magnetic resonance method, the antenna device preferably includes a highly precise Q factor (sharpness of resonance) at a specific frequency in order to increase a power transmission efficiency. The preferred embodiments of the present invention prevent the inductance of the coil antenna from varying and inhibits the Q factor (sharpness of resonance) and the resonant frequency from varying. Accordingly, a stable power transmission system is able to be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
   a coil antenna including a coil conductor wound around an axis;
   a planar conductor; and
   a magnetic member; wherein
   the coil antenna includes a first region in which the coil conductor overlaps the planar conductor in a plan view of the planar conductor and a second region in which the coil conductor does not overlap the planar conductor in the plan view of the planar conductor;
   an average value of widths in a radial direction of the coil conductor included in the second region is less than an average value of widths in the radial direction of the coil conductor included in the first region; and
   the first region of the coil antenna is between the magnetic member and the planar conductor.

2. The antenna device according to claim 1, wherein
   the planar conductor includes a notch portion extending from an inside of the antenna device toward an outer edge of the antenna device; and
   at least a portion of a coil opening of the coil antenna overlaps the notch portion in a plan view of the planar conductor.

3. The antenna device according to claim 2, wherein an inside portion of the notch portion located at the inside of the antenna device is wider than an outside portion of the notch portion located at the outer edge of the antenna device.

4. The antenna device according to claim 3, wherein a terminal device or electronic component is located in the inside portion of the notch portion.

5. The antenna device according to claim 2, wherein an electric current flowing through the planar conductor encloses the notch portion.

6. An electronic device, comprising:
a housing; and
the antenna device according to claim 1; wherein
the planar conductor is defined by at least a portion of the housing or a ground conductor of a printed circuit board included in the electronic device.

7. The antenna device according to claim 1, wherein the coil antenna further includes a substrate, a first electrode, and a second electrode.

8. The antenna device according to claim 7, wherein the coil conductor includes a spiral conductor located on a first main surface of the substrate and a routing conductor located on a second main surface of the substrate.

9. The antenna device according to claim 8, wherein
the first electrode is provided on the first main surface of the substrate and electrically connected to an outer circumferential end of the spiral conductor; and
the second electrode is provided on the first main surface of the substrate and electrically connected to an inner circumferential end of the spiral conductor.

10. The antenna device according to claim 1, wherein the planar conductor defines and functions as a booster antenna for the coil antenna.

11. An antenna device comprising:
a coil antenna including a coil conductor wound around an axis;
a planar conductor; and
a magnetic member; wherein
the coil antenna includes a first region in which the coil conductor overlaps the planar conductor in a plan view of the planar conductor and a second region in which the coil conductor does not overlap the planar conductor in the plan view of the planar conductor;
at least a first portion of the coil conductor overlaps at least a second portion of the coil conductor in the second region; and
the first region of the coil antenna is between the magnetic member and the planar conductor.

12. The antenna device according to claim 11, wherein a line width of a portion of the coil conductor in the first region is wider than that in the second region.

13. The antenna device according to claim 11, wherein a number of turns of the coil conductor is more than one.

* * * * *